(12) United States Patent
Yamazaki et al.

(10) Patent No.: US 8,748,886 B2
(45) Date of Patent: Jun. 10, 2014

(54) SEMICONDUCTOR DEVICE AND METHOD FOR MANUFACTURING SEMICONDUCTOR DEVICE

(75) Inventors: Shunpei Yamazaki, Setagaya (JP);
Satoshi Shinohara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/533,121

(22) Filed: Jun. 26, 2012

(65) Prior Publication Data
US 2013/0009220 A1    Jan. 10, 2013

(30) Foreign Application Priority Data
Jul. 8, 2011   (JP) .................. 2011-152190

(51) Int. Cl.
*H01L 29/786*   (2006.01)
(52) U.S. Cl.
USPC .......................................................... 257/43
(58) Field of Classification Search
USPC ........ 257/57, 59, 72, 359, 390, 443, E21.411, 257/221.412, E51.005, E29.151, E27.1, 257/E29.117; 349/43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,207,969 B1 * | 3/2001 | Yamazaki | 257/49 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Ono et al., "Novel High Performance IGZO-TFT with High Mobility over 40 cm$^2$/Vs and High Photostability Incorporated Oxygen Diffusion," IDW '11: Proceedings of the 18$^{th}$ International Display Workshops, Dec. 7, 2011, pp. 1689-1690.

(Continued)

*Primary Examiner* — Steven Loke
*Assistant Examiner* — Mouloucoulaye Inoussa
(74) *Attorney, Agent, or Firm* — Eric J. Robinson; Robinson Intellectual Property Law Office, P.C.

(57) ABSTRACT

A transistor which is formed using an oxide semiconductor layer and has electric characteristics needed for the intended use, and a semiconductor device including the transistor are provided. The transistor is formed using an oxide semiconductor stack including at least a first oxide semiconductor layer in contact with a source electrode layer and a drain electrode layer and a second oxide semiconductor layer which is provided over the first oxide semiconductor layer and has an energy gap different from that of the first oxide semiconductor layer. There is no limitation on the stacking order of the first oxide semiconductor layer and the second oxide semiconductor layer as long as their energy gaps are different from each other.

24 Claims, 17 Drawing Sheets

(56) References Cited

U.S. PATENT DOCUMENTS

| | | | |
|---|---|---|---|
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0236596 A1 | 9/2009 | Itai | |
| 2009/0261325 A1* | 10/2009 | Kawamura et al. | 257/43 |
| 2009/0278122 A1 | 11/2009 | Hosono et al. | |
| 2009/0280600 A1 | 11/2009 | Hosono et al. | |
| 2009/0321732 A1* | 12/2009 | Kim et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163866 A1* | 7/2010 | Akimoto et al. | 257/43 |
| 2011/0127522 A1* | 6/2011 | Yamazaki | 257/43 |
| 2011/0127523 A1* | 6/2011 | Yamazaki | 257/43 |
| 2011/0140100 A1* | 6/2011 | Takata et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-231613 A | 10/2009 |
| WO | WO-2004/114391 | 12/2004 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 In. QVGA AMOLED Display Using IN-GA-ZN-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner 1003
1002
1001
1000

1003
1002
1001
1000

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer is formed using an amorphous oxide containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

An improvement in on-state characteristics (e.g., on-state current and field-effect mobility) of a transistor leads to high-speed response to an input signal and high-speed drive of a semiconductor device; thus, a semiconductor device with higher performance can be achieved. On the other hand, sufficiently low off-state current is needed to reduce power consumption of a semiconductor device. That is, required electric characteristics of a transistor vary with uses and purposes of the transistor, and it is profitable to control the electric characteristics more accurately.

An object of one embodiment of the present invention is to provide a structure of a transistor in which an oxide semiconductor is used for a channel formation region and the threshold voltage, which is one of electric characteristics of a transistor, can be positive, and to provide a manufacturing method thereof, in order to achieve a so-called normally-off switching element.

In a transistor, it is preferable that a channel be formed at positive gate threshold voltage which is as close to 0 V as possible. If the threshold voltage of the transistor is negative, the transistor tends to be in a so-called normally-on state, in which current flows between the source electrode and the drain electrode even when the gate voltage is 0 V. For an LSI, a CPU, or a memory, electric characteristics of a transistor included in a circuit are important, and the power consumption of the semiconductor device depends on the electric characteristics. In particular, of the electric characteristics of the transistor, the threshold voltage (Vth) is important. If the threshold voltage is negative even when the field-effect mobility is high, it is difficult to control the circuit. Such a transistor in which a channel is formed even at negative voltage so that drain current flows is not suitable as a transistor used in an integrated circuit of a semiconductor device.

Further, it is important to achieve the characteristics of a transistor close to the normally-off characteristics even when the transistor is not a normally-off transistor depending on the material or the manufacturing condition. Another object of one embodiment of the present invention is to provide a structure for achieving the threshold voltage of a transistor close to zero even when the threshold voltage is negative, that is, even when the transistor is a so-called normally-on transistor, and to provide a manufacturing method thereof.

Another object of one embodiment of the present invention is to provide a structure of a semiconductor device which achieves high-speed response and high-speed drive by improving on-state characteristics (e.g., on-state current and field-effect mobility) of a transistor, and to provide a manufacturing method thereof, in order to achieve a semiconductor device with higher performance.

As described above, an object of one embodiment of the present invention is to provide a transistor which is formed using an oxide semiconductor layer and has electric characteristics needed for the intended use, and to provide a semiconductor device including the transistor.

In a transistor in which a source electrode layer and a drain electrode layer, a semiconductor layer, a gate insulating film, and a gate electrode layer are stacked in this order, an oxide semiconductor layer in which at least two oxide semiconductor layers with different energy gaps are stacked (hereinafter such an oxide semiconductor layer is also referred to as an oxide semiconductor stack) is used as the semiconductor layer.

For example, the transistor is formed using an oxide semiconductor stack including a first oxide semiconductor layer in contact with the source electrode layer and the drain electrode layer and a second oxide semiconductor layer which is provided over the first oxide semiconductor layer and has an energy gap different from that of the first oxide semiconductor layer. Here, there is no limitation on the stacking order of the first oxide semiconductor layer and the second oxide semiconductor layer as long as their energy gaps are different from each other. Specifically, the energy gap of one of the oxide semiconductor layers may be 3 eV or larger, and the energy gap of the other oxide semiconductor layer may be smaller than 3 eV.

Note that in this specification and the like, the term "energy gap" is used to mean the terms "band gap" and "forbidden band gap".

Further, the oxide semiconductor stack may include three or more oxide semiconductor layers. In the case where the oxide semiconductor stack includes three or more oxide semiconductor layers, all the oxide semiconductor layers may have energy gaps different from each other, or some of the oxide semiconductor layers in the oxide semiconductor stack may have energy gaps equivalent to each other.

For example, an oxide semiconductor stack can include a first oxide semiconductor layer in contact with a source electrode layer and a drain electrode layer; a second oxide semiconductor layer which is provided over the first oxide semiconductor layer and has a higher electron affinity than the first oxide semiconductor layer or a smaller energy gap than the first oxide semiconductor layer; and a third oxide semiconductor layer which is provided over the second oxide semiconductor layer. Note that the electron affinity and energy gap of the third oxide semiconductor layer are preferably equivalent to the electron affinity and energy gap of the first oxide semiconductor layer. Here, the electron affinity means an energy gap between a vacuum level and a bottom of a conduction band of an oxide semiconductor. With the structure in which the second oxide semiconductor layer with a small energy gap is sandwiched between the first oxide semiconductor layer and the third oxide semiconductor layer with large energy gaps, the off-state current (leakage current) of the transistor can be further reduced.

Specifically, the energy gaps of the first oxide semiconductor layer and the third oxide semiconductor layer are each 3 eV or larger, and the energy gap of the second oxide semiconductor layer is smaller than 3 eV. In a transistor formed using an oxide semiconductor layer, the energy gap of the oxide semiconductor layer affects electric characteristics of the transistor. For example, the smaller the energy gap of an oxide semiconductor layer used in a transistor is, the higher on-state characteristics (e.g., on-state current and field-effect mobility) can be. On the other hand, the larger the energy gap of the oxide semiconductor layer is, the smaller off-state current can be.

In the case of a single oxide semiconductor layer, electric characteristics of a transistor are almost determined by the energy gap of the oxide semiconductor layer; thus, it is difficult for the transistor to have desired electric characteristics. However, in a transistor according to one embodiment of the present invention, an oxide semiconductor stack including a plurality of oxide semiconductor layers with different energy gaps is used, whereby electric characteristics of the transistor can be more accurately controlled and desired electric characteristics can be given to the transistor.

Therefore, a semiconductor device which meets various purposes such as high performance, high reliability, and low power consumption can be provided.

One embodiment of the present invention is a semiconductor device including a source electrode layer and a drain electrode layer formed over an insulating surface, an oxide semiconductor stack provided over the source electrode layer and the drain electrode layer, a gate insulating film provided over the oxide semiconductor stack, and a gate electrode layer overlapping with the oxide semiconductor stack with the gate insulating film positioned therebetween. The oxide semiconductor stack includes a first oxide semiconductor layer and a second oxide semiconductor layer having an energy gap different from that of the first oxide semiconductor layer.

Another embodiment of the present invention is a semiconductor device including a source electrode layer and a drain electrode layer formed over an insulating surface, an oxide semiconductor stack provided over the source electrode layer and the drain electrode layer, a gate insulating film provided over the oxide semiconductor stack, and a gate electrode layer overlapping with the oxide semiconductor stack with the gate insulating film positioned therebetween. The oxide semiconductor stack includes a first oxide semiconductor layer, a second oxide semiconductor layer that is in contact with the first oxide semiconductor layer and has a smaller energy gap than the first oxide semiconductor layer, and a third oxide semiconductor layer that is in contact with the second oxide semiconductor layer and has a larger energy gap than the second oxide semiconductor layer.

In the above semiconductor device, the third oxide semiconductor layer may be provided over the second oxide semiconductor layer so as to cover a side surface of the first oxide semiconductor layer and a side surface of the second oxide semiconductor layer.

In any of the above semiconductor devices, a region which is in the oxide semiconductor stack and does not overlap with the gate electrode layer preferably contains a dopant. In such a structure, the oxide semiconductor stack has a channel formation region which overlaps with the gate electrode layer with the gate insulating film positioned therebetween, and a pair of low-resistance regions between which the channel formation region is sandwiched in the channel length direction.

With the oxide semiconductor layer including the low-resistance regions between which the channel formation region is sandwiched in the channel length direction, on-state characteristics (e.g., on-state current and field-effect mobility) of the transistor are improved, which enables high-speed operation and high-speed response of the transistor. Further, the low-resistance regions are formed in a self-aligned manner and do not overlap with the gate electrode layer; thus parasitic capacitance can be reduced. The reduction in parasitic capacitance leads to a reduction in the power consumption of the whole semiconductor device.

The concentration of the dopant in the low-resistance regions is preferably higher than or equal to $5 \times 10^{18}/cm^3$ and lower than or equal to $1 \times 10^{22}/cm^3$.

Another embodiment of the present invention is a method for manufacturing a semiconductor device, including the steps of forming a source electrode layer and a drain electrode layer over an oxide insulating film; forming an oxide semiconductor stack over the source electrode layer and the drain electrode layer; forming a gate insulating film over the source electrode layer, the drain electrode layer, and the oxide semiconductor stack; and forming a gate electrode layer overlapping with the oxide semiconductor stack with the gate insulating film positioned therebetween. The oxide semiconductor stack includes a first oxide semiconductor layer and a second oxide semiconductor layer having an energy gap different from that of the first oxide semiconductor layer.

Another embodiment of the present invention is a method for manufacturing a semiconductor device, including the steps of forming a source electrode layer and a drain electrode layer over an oxide insulating film; forming an oxide semiconductor stack over the source electrode layer and the drain electrode layer; forming a gate insulating film over the source electrode layer, the drain electrode layer, and the oxide semiconductor stack; and forming a gate electrode layer overlapping with the oxide semiconductor stack with the gate insulating film positioned therebetween. The oxide semiconductor stack includes a first oxide semiconductor layer, a second oxide semiconductor layer having a smaller energy gap than the first oxide semiconductor layer, and a third oxide semiconductor layer having a larger energy gap than the second oxide semiconductor layer.

In the above method for manufacturing a semiconductor device, the third oxide semiconductor layer may be stacked so as to cover a side surface of the first oxide semiconductor layer and a side surface of the second oxide semiconductor layer.

In any one of the above methods for manufacturing a semiconductor device, oxygen may be introduced into the oxide semiconductor stack from above the gate insulating film after the gate insulating film is formed.

In any one of the above methods for manufacturing a semiconductor device, a dopant may be introduced into the oxide semiconductor stack in a self-aligned manner with the use of the gate electrode layer as a mask after the gate electrode layer is formed.

By using an oxide semiconductor stack including a plurality of oxide semiconductor layers with energy gaps different from each other, electric characteristics of a transistor can be more accurately controlled and desired electric characteristics can be given to the transistor.

Therefore, a semiconductor device which meets various purposes such as high performance, high reliability, and low power consumption can be provided.

DETAILED DESCRIPTION OF THE INVENTION

Figure 1A:
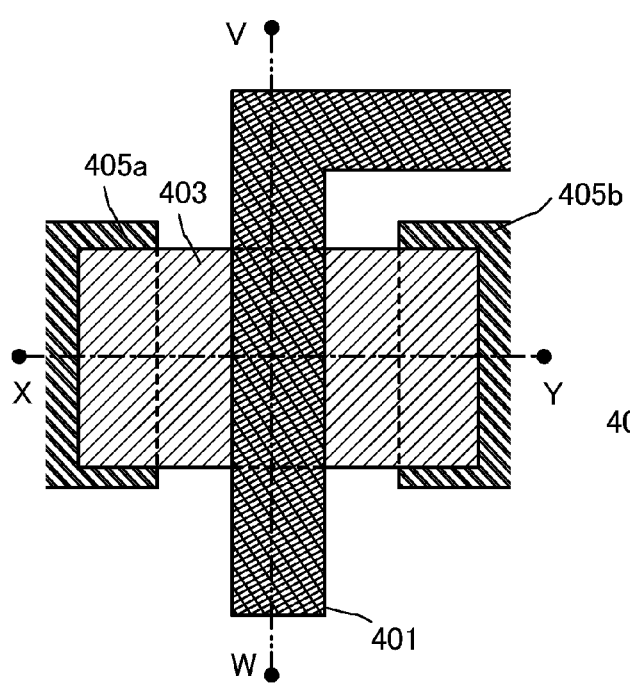
FIG. 1A is a plan view of a semiconductor device according to one embodiment of the present invention.

Hereinafter, embodiments and examples of the present invention will be described in detail with reference to the accompanying drawings. Note that the present invention is not limited to the description below and it is easily understood by those skilled in the art that the mode and details can be changed variously. Therefore, the present invention should not be construed as being limited to the description in the embodiments and examples below.

Note that in structures of the present invention described below, the same portions or portions having similar functions are denoted by the same reference numerals in different drawings, and description thereof is not repeated. Further, in some cases, the same hatching patterns are applied to portions having similar functions, and such portions are not especially designated by reference numerals.

Note that in each drawing described in this specification and the like, the size, the film thickness, or the region of each component is exaggerated for clarity in some cases. Therefore, embodiments and examples of the present invention are not limited to such scales.

Note that the ordinal numbers such as "first" and "second" in this specification and the like are used for convenience and do not denote the order of steps or the stacking order of layers. In addition, the ordinal numbers in this specification and the like do not denote particular names which specify the invention.

Embodiment 1

In this embodiment, one embodiment of a semiconductor device and one embodiment of a method for manufacturing the semiconductor device are described with reference to FIGS. 1A to 1C and FIGS. 2A to 2D. In this embodiment, a transistor including an oxide semiconductor stack is described as an example of the semiconductor device.

Figure 1C:
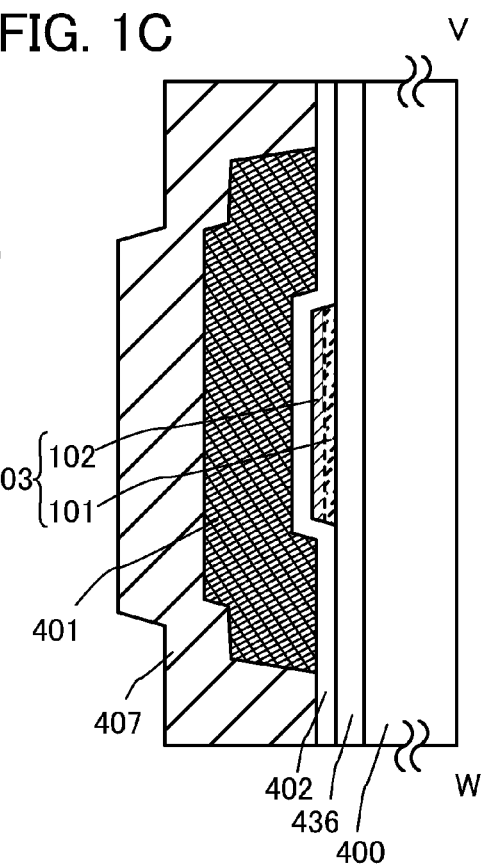
FIGS. 1B and 1C are cross-sectional views thereof.
Figure 1B:
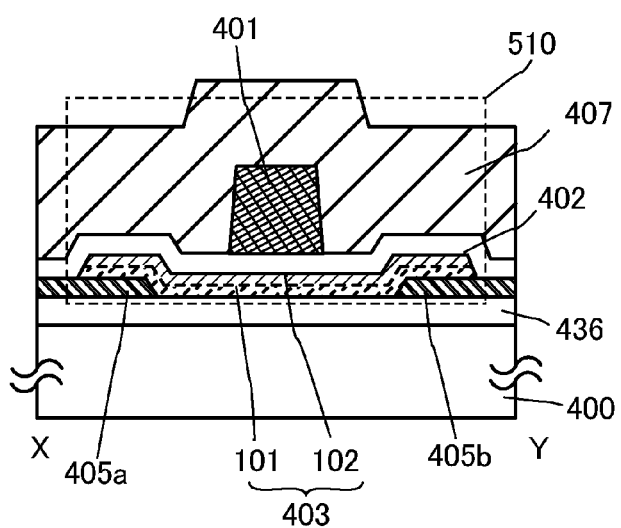

A transistor 510 illustrated in FIGS. 1A to 1C is an example of a top-gate transistor. FIG. 1A is a plan view, FIG. 1B is a cross-sectional view taken along chain line X-Y in FIG. 1A, and FIG. 1C is a cross-sectional view taken along chain line V-W in FIG. 1A.

As illustrated in FIG. 1B, which is a cross-sectional view in the channel length direction, the transistor 510 includes, over a substrate 400 which has an insulating surface and is provided with an oxide insulating film 436, a source electrode layer 405a, a drain electrode layer 405b, an oxide semiconductor stack 403 which is provided over the source electrode layer 405a and the drain electrode layer 405b and includes a first oxide semiconductor layer 101 and a second oxide semiconductor layer 102, a gate insulating film 402, and a gate electrode layer 401. An insulating film 407 is formed over the transistor 510.

Note that in FIGS. 1B and 1C, an interface between the oxide semiconductor layers included in the oxide semiconductor stack 403 is schematically illustrated by a dotted line. The dotted line schematically indicates the interface between the oxide semiconductor layers included in the oxide semiconductor stack, which is unclear (indistinct); the same applies to other drawings in this specification. Note that when the interface is unclear, a continuous boundary cannot be observed between the oxide semiconductor layers in a cross-sectional observation image (TEM image) of the oxide semiconductor stack, which is taken using a transmission electron microscope (TEM).

In the oxide semiconductor stack 403, the stacking order of the first oxide semiconductor layer 101 and the second oxide semiconductor layer 102 is not limited by the magnitude of their energy gaps as long as the energy gaps are different from each other.

Specifically, in the oxide semiconductor stack 403, the energy gap of one of the oxide semiconductor layers is 3 eV or larger, and the energy gap of the other oxide semiconductor layer is smaller than 3 eV. As an oxide semiconductor with an energy gap of 3 eV or larger, for example, an In—Ga—Zn-based oxide semiconductor (energy gap: 3.0 eV to 3.4 eV, typically 3.2 eV) can be used. As an oxide semiconductor with an energy gap smaller than 3 eV, for example, an In—Sn—Zn-based oxide semiconductor (energy gap: 2.6 eV to 2.9 eV, typically 2.8 eV) can be used.

FIGS. 2A to 2D illustrate an example of a method for manufacturing the transistor 510.

First, the oxide insulating film 436 is formed over the substrate 400 having an insulating surface.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like; a ceramic substrate; a quartz substrate; or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or any of these substrates provided with a semiconductor element may be used as the substrate 400.

The semiconductor device may be manufactured using a flexible substrate as the substrate 400. In order to manufacture a flexible semiconductor device, the transistor including the oxide semiconductor stack may be directly formed over a flexible substrate. Alternatively, the transistor including the oxide semiconductor stack may be formed over a manufacturing substrate, and then the transistor may be separated and transferred to a flexible substrate. Note that in order to separate the transistor including the oxide semiconductor stack from the manufacturing substrate and transfer it to the flexible substrate, a separation layer may be provided between the manufacturing substrate and the transistor.

The oxide insulating film 436 can be formed by a plasma CVD method, a sputtering method, or the like using silicon oxide, silicon oxynitride, aluminum oxide, aluminum oxynitride, hafnium oxide, gallium oxide, silicon nitride oxide, aluminum nitride oxide, or a mixed material of any of these materials. A silicon oxide film formed by a sputtering method is used as the oxide insulating film 436 in this embodiment.

The oxide insulating film 436 may be a single layer or a stack of layers. For example, a silicon oxide film, an In—Hf—Zn-based oxide film may be sequentially stacked over the substrate 400. Alternatively, a silicon oxide film, an In—Zr—Zn-based oxide film with an atomic ratio of In:Zr:Zn=1:1:1 may be sequentially stacked over the substrate 400. Further alternatively, a silicon oxide film, an In—Gd—Zn-based oxide film with an atomic ratio of In:Gd:Zn=1:1:1 may be sequentially stacked over the substrate 400.

In the transistor 510, the oxide insulating film 436 is in contact with the lowermost layer of the oxide semiconductor stack 403, and thus (the bulk of) the oxide insulating film 436 preferably contains oxygen at least in excess of the stoichiometric ratio. For example, in the case where a silicon oxide film is used as the oxide insulating film 436, the composition formula is $SiO_{2+\alpha}$ ($\alpha>0$). By using such a film as the oxide insulating film 436, oxygen can be supplied to the oxide semiconductor stack formed over the oxide insulating film 436, leading to favorable characteristics. By supply of oxygen to the oxide semiconductor stack, an oxygen vacancy therein can be filled.

Next, a conductive film which is to be a source electrode layer and a drain electrode layer (including a wiring formed in the same layer as the source electrode layer and the drain electrode layer) is formed over the oxide insulating film 436 and is selectively etched, so that the source electrode layer 405a and the drain electrode layer 405b are formed. The conductive film used for the source electrode layer 405a and the drain electrode layer 405b is formed using a material that can withstand heat treatment performed later; for example, a metal film containing an element selected from Al, Cr, Cu, Ta, Ti, Mo, and W, or a metal nitride film containing any of the above elements as a component (titanium nitride film, molybdenum nitride film, or tungsten nitride film) can be used. Alternatively, a film of a high-melting-point metal such as Ti, Mo, or W or a metal nitride film of any of these elements (titanium nitride film, molybdenum nitride film, or tungsten nitride film) may be stacked on one or both of a bottom side and a top side of a metal film of Al, Cu, or the like. Further alternatively, the conductive film used for the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

In this embodiment, a 10-nm-thick tungsten film is formed as the source electrode layer 405a and the drain electrode layer 405b. Such a small thickness of the source electrode layer 405a and the drain electrode layer 405b leads to favorable coverage with the oxide semiconductor stack 403 formed thereover.

Figure 2A:
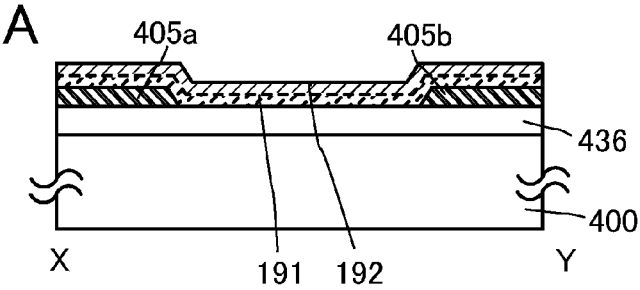
FIGS. 2A to 2D illustrate a method for manufacturing a semiconductor device according to one embodiment of the present invention.

Next, a first oxide semiconductor film 191 and a second oxide semiconductor film 192 which are to be the first oxide semiconductor layer 101 and the second oxide semiconductor layer 102, respectively, are formed over the source electrode layer 405a and the drain electrode layer 405b (see FIG. 2A).

The first oxide semiconductor film 191 and the second oxide semiconductor film 192 are oxide semiconductor films with energy gaps different from each other. For example, the energy gap of one of the oxide semiconductor films may be 3 eV or larger, and the energy gap of the other oxide semiconductor film may be smaller than 3 eV.

In the steps of forming the first oxide semiconductor film 191 and the second oxide semiconductor film 192, in order to prevent hydrogen and moisture from being contained in the oxide semiconductor films as much as possible, it is preferable that the substrate over which the oxide insulating film 436, the source electrode layer 405a, and the drain electrode layer 405b are formed be preheated in a preheating chamber of a sputtering apparatus as pretreatment for film formation so that impurities such as hydrogen and moisture adsorbed onto the substrate, the oxide insulating film 436, and the like are desorbed and eliminated. As an evacuation unit provided in the preheating chamber, a cryopump is preferable.

Each of oxide semiconductors used for the first oxide semiconductor film 191 and the second oxide semiconductor film 192 preferably contains at least indium (In) or zinc (Zn). In particular, In and Zn are preferably contained. In addition, as a stabilizer for reducing variation in electric characteristics of a transistor formed using the oxide, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an I—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure. Note that in some cases, the energy gaps differ between single crystal and non-single-crystal even when the same material is used. Thus, it is important to select the material based on the energy gap as appropriate.

Further, for the oxide semiconductor stack, an oxide semiconductor film including a crystal and having crystallinity (crystalline oxide semiconductor film) can be used. The crystals in the crystalline oxide semiconductor film may have crystal axes oriented in random directions or in a certain direction.

For example, as the crystalline oxide semiconductor film, a c-axis aligned crystalline oxide semiconductor (CAAC-OS) film can be used.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. From an observation image obtained with a TEM, a boundary between an amorphous part and a crystal part in the CAAC-OS film is not clear. Further, with the TEM, a grain boundary in the CAAC-OS film is not found. Thus, a reduction in electron mobility due to the grain boundary is suppressed in the CAAC-OS film.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to an a-b plane is formed, and metal atoms are arranged in a layered manner or metal atoms and oxygen atoms are arranged in a layered manner when seen from the direction perpendicular to the c-axis. Note that among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor including the CAAC-OS film, a change in electric characteristics due to irradiation with visible light or ultraviolet light can be suppressed; therefore, a semiconductor device including the transistor can have high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The first oxide semiconductor film 191 and the second oxide semiconductor film 192 each have a thickness greater than or equal to 5 nm and less than or equal to 10 nm (preferably greater than or equal to 5 nm and less than or equal to 30 nm) and can be formed by a sputtering method, a molecular beam epitaxy (MBE) method, a CVD method, a pulsed laser deposition method, an atomic layer deposition (ALD) method, or the like as appropriate. The first oxide semiconductor film 191 and the second oxide semiconductor film 192 may each be formed using a sputtering apparatus which performs film formation with surfaces of a plurality of substrates set substantially perpendicular to a surface of a sputtering target.

Note that it is preferable that the first oxide semiconductor film 191 and the second oxide semiconductor film 192 be each formed under a condition that much oxygen is contained during film formation (e.g., by a sputtering method in a 100% oxygen atmosphere), so that a film containing much oxygen (preferably including a region where the amount of oxygen exceeds that in the stoichiometric ratio of the oxide semiconductor in a crystal state) is formed.

In this embodiment, a target used for formation of the first oxide semiconductor film 191 by a sputtering method is, for example, a metal oxide target having a composition ratio of $In_2O_3:Ga_2O_3:ZnO=1:1:2$ [molar ratio], so that an In—Ga—Zn-based oxide film is formed. The material and composition of the target are not limited thereto; for example, a metal oxide target having a composition ratio of $In_2O_3:Ga_2O_3:ZnO=1:1:1$ [molar ratio] may be used.

It is preferable that a high-purity gas from which impurities such as hydrogen, water, a hydroxyl group, and a hydride are removed be used as a sputtering gas for the formation of the first oxide semiconductor film 191 and the second oxide semiconductor film 192.

The oxide insulating film 436 and the oxide semiconductor stack are preferably formed in succession without exposure to the air. When the oxide insulating film 436 and the oxide semiconductor stack are formed in succession without exposure to the air, impurities such as hydrogen and moisture can be prevented from being adsorbed onto a surface of the oxide insulating film 436.

Next, the first oxide semiconductor film 191 and the second oxide semiconductor film 192 are processed into an island shape by a photolithography process, so that the oxide semiconductor stack 403 including the first oxide semiconductor layer 101 and the second oxide semiconductor layer 102 is formed.

A resist mask used for forming the oxide semiconductor stack 403 (the first oxide semiconductor layer 101 and the second oxide semiconductor layer 102) may be formed by ink jetting. Formation of the resist mask by ink jetting needs no photomask; thus, manufacturing cost can be reduced.

Note that etching of the first oxide semiconductor film 191 and the second oxide semiconductor film 192 may be dry etching, wet etching, or both dry etching and wet etching.

In this embodiment, since the first oxide semiconductor film 191 and the second oxide semiconductor film 192 are etched with the same mask, the first oxide semiconductor layer 101 and the second oxide semiconductor layer 102, which have been processed, have the same shape where end portions of side surfaces thereof are aligned. In the oxide semiconductor stack 403, which has been processed into an island shape, the side surface (end portions) of the first oxide semiconductor layer 101 and the side surface (end portions) of the second oxide semiconductor layer 102 are exposed.

Heat treatment may be performed on the oxide semiconductor stack 403 in order to remove excess hydrogen (including water and a hydroxyl group) (to perform dehydration or dehydrogenation). The temperature of the heat treatment is higher than or equal to 300° C. and lower than or equal to 700° C. or lower than the strain point of the substrate. The heat treatment can be performed in a reduced-pressure atmosphere, a nitrogen atmosphere, or the like. For example, after the substrate is put in an electric furnace which is a kind of heat treatment apparatus, the oxide semiconductor stack 403 is subjected to heat treatment at 450° C. for one hour in a nitrogen atmosphere.

Note that the heat treatment apparatus is not limited to an electric furnace, and an apparatus for heating an object to be processed by heat conduction or heat radiation from a heating element such as a resistance heating element may be alternatively used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at a high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor stack 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb, in the measurement using a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, and the like be not contained in the oxygen gas or the $N_2O$ gas. The purity of the oxygen gas or the $N_2O$ gas which is introduced into the heat treatment apparatus is preferably 6N or higher, further preferably 7N or higher (i.e., the impurity concentration in the oxygen gas or the $N_2O$ gas is preferably 1 ppm or lower, further preferably 0.1 ppm or lower). The oxygen gas or the $N_2O$ gas acts to supply oxygen that is a main component of the oxide semiconductor and is reduced through the step of removing an impurity for dehydration or dehydrogenation, so that the oxide semiconductor stack 403 can be highly purified and become an i-type (intrinsic) oxide semiconductor.

The heat treatment for dehydration or dehydrogenation may be performed any time in the manufacturing process of the transistor 510 as long as it is performed between the formation of the oxide semiconductor films and subsequent formation of the insulating film 407. For example, the heat treatment can be performed between the formation of the second oxide semiconductor film 192 and the processing into an island shape, or after formation of the gate insulating film 402.

The heat treatment for dehydration or dehydrogenation may be performed plural times, and may also serve as another heat treatment. For example, heat treatment may be performed twice: after the formation of the first oxide semiconductor film 191 and after the formation of the second oxide semiconductor film 192.

Note that the heat treatment for dehydration or dehydrogenation is preferably performed before the first oxide semiconductor film 191 and the second oxide semiconductor film 192 are processed into an island shape because oxygen contained in the oxide insulating film 436 can be prevented from being released by the heat treatment.

By being subjected to the heat treatment for dehydration or dehydrogenation in a state of being at least partly in contact with the oxide insulating film 436 which is an insulating film containing oxygen, the oxide semiconductor stack 403 can be supplied with oxygen from the oxide insulating film 436. Alternatively, an insulating film containing oxygen may be formed as the gate insulating film 402, and oxygen may be supplied from the gate insulating film 402 to the oxide semiconductor stack 403 by performing the heat treatment for dehydration or dehydrogenation after the formation of the gate insulating film 402. Supply of oxygen from the insulating film in contact with the oxide semiconductor stack 403 enables an oxygen vacancy in the oxide semiconductor stack 403 to be filled and the oxide semiconductor stack 403 to be highly purified and become an i-type (intrinsic) oxide semiconductor. In the heat treatment for dehydration or dehydrogenation, it is preferable that (the bulk of) the insulating film in contact with the oxide semiconductor stack 403 contain oxygen at least in excess of the stoichiometric ratio.

Figure 2B:
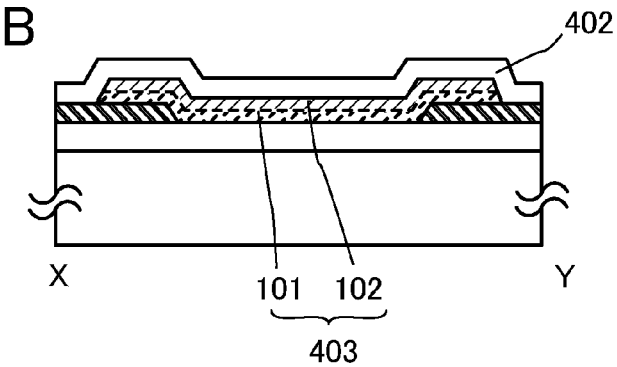

Next, the gate insulating film 402 is formed to cover the oxide semiconductor stack 403, the source electrode layer 405a, and the drain electrode layer 405b (see FIG. 2B).

The gate insulating film 402 has a thickness greater than or equal to 1 nm and less than or equal to 20 nm and can be formed by a sputtering method, an MBE method, a CVD method, a pulsed laser deposition method, an ALD method, or the like as appropriate. The gate insulating film 402 may be formed using a sputtering apparatus which performs film formation with surfaces of a plurality of substrates set substantially perpendicular to a surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

When the gate insulating film 402 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. Further, the gate insulating film 402 may have a single-layer structure or a stacked structure.

Figure 2C:
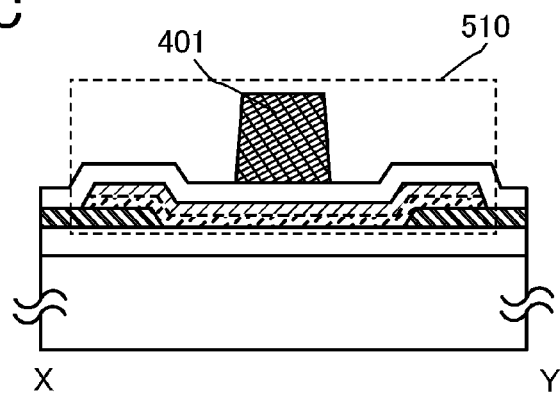

Next, the gate electrode layer 401 is formed over the gate insulating film 402 by a plasma CVD method, a sputtering method, or the like (see FIG. 2C). In this manner, the transistor 510 in this embodiment is manufactured.

The gate electrode layer 401 can be formed using a metal material such as molybdenum, titanium, tantalum, tungsten, aluminum, copper, chromium, neodymium, or scandium or an alloy material containing any of these materials as a main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked structure of the above conductive material and the above metal material.

As one layer of the gate electrode layer 401 which is in contact with the gate insulating film 402, a metal oxide containing nitrogen, specifically, an In—Ga—Zn-based oxide film containing nitrogen, an In—Sn-based oxide film containing nitrogen, an In—Ga-based oxide film containing nitrogen, an In—Zn-based oxide film containing nitrogen, a Sn-based oxide film containing nitrogen, an In-based oxide film containing nitrogen, or a metal nitride (InN, SnN, or the like) film can be used. These films each have a work function of 5 eV or higher, preferably 5.5 eV or higher, which enables the threshold voltage, which is one of electric characteristics of a transistor, to be positive when used for the gate electrode layer. Accordingly, a so-called normally-off switching element can be provided.

Figure 2D:
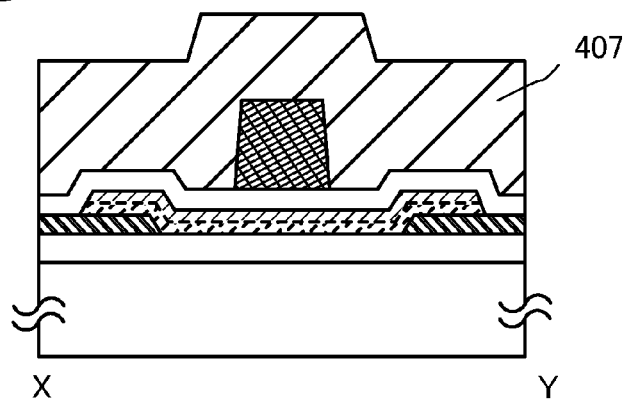

Note that the insulating film 407 may be formed over the gate insulating film 402 and the gate electrode layer 401 so as to cover the transistor 510 (see FIG. 2D).

As the insulating film 407, a silicon oxide film or another inorganic insulating film such as, typically, an aluminum oxide film, a silicon oxynitride film, an aluminum oxynitride film, or a gallium oxide film can be used. For example, as the insulating film 407, a stack of a silicon oxide film and an aluminum oxide film can be used.

An aluminum oxide film which can be used as the insulating film 407 has a high shielding effect (blocking effect), which is not permeable to either oxygen or impurities such as hydrogen and moisture.

As the insulating film 407, a planarization insulating film may be used. For the planarization insulating film, an organic material such as polyimide resin, an acrylic resin, or a benzocyclobutene-based resin can be used. Other than such organic materials, it is also possible to use a low-dielectric constant material (low-k material) or the like. Note that the planarization insulating film may be formed by stacking a plurality of insulating films formed of any of these materials.

The transistor 510 described in this embodiment is formed using the oxide semiconductor stack 403 including the two oxide semiconductor layers with energy gaps different from each other. In a transistor formed using an oxide semiconductor layer, the energy gap of the oxide semiconductor layer affects electric characteristics of the transistor. For example, the smaller the energy gap of an oxide semiconductor layer used in a transistor is, the higher on-state characteristics (e.g., on-state current and field-effect mobility) can be. On the other hand, the larger the energy gap of the oxide semiconductor layer is, the smaller off-state current can be. By using the oxide semiconductor stack 403 including the plurality of oxide semiconductor layers with energy gaps different from each other for the transistor 510, electric characteristics thereof can be more accurately controlled and desired electric characteristics can be given to the transistor 510.

Further, by dehydration or dehydrogenation and subsequent supply of oxygen, the oxide semiconductor stack 403 used for the transistor 510 can be highly purified and oxygen vacancies in the oxide semiconductor stack 403 can be reduced. From the oxide semiconductor stack 403, impurities such as hydrogen and water are sufficiently removed; the hydrogen concentration in the oxide semiconductor stack 403 can be $5\times10^{19}/cm^3$ or lower, preferably $5\times10^{18}/cm^3$ or lower. Note that the hydrogen concentration in the oxide semiconductor stack 403 is measured by secondary ion mass spectrometry (SIMS).

In the transistor formed using the highly purified oxide semiconductor stack 403 containing excess oxygen with which an oxygen vacancy is filled, the current value in the off state (off-state current value) per micrometer of channel width can be reduced to a value less than or equal to 100 zA/μm (1 zA (zeptoampere) is $1\times10^{-21}$ A), preferably less than or equal to 10 zA/μm, further preferably less than or equal to 1 zA/μm, still further preferably less than or equal to 100 yA/μm at room temperature.

With the use of the thus obtained transistor having excellent electric characteristics, a semiconductor device with high performance and high reliability can be provided.

The structures, methods, and the like described in this embodiment can be combined as appropriate with any of the structures, methods, and the like described in the other embodiments.

Embodiment 2

In this embodiment, examples of a transistor which can be obtained by a process partly changed from that in Embodiment 1 are described with reference to FIGS. 3A to 3D, FIGS. 4A to 4D, and FIGS. 5A and 5B. In this embodiment, as for the same portions as Embodiment 1 or portions having functions similar to those in Embodiment 1 and steps, Embodiment 1 can be referred to and repetitive description is omitted.

Figure 3A:
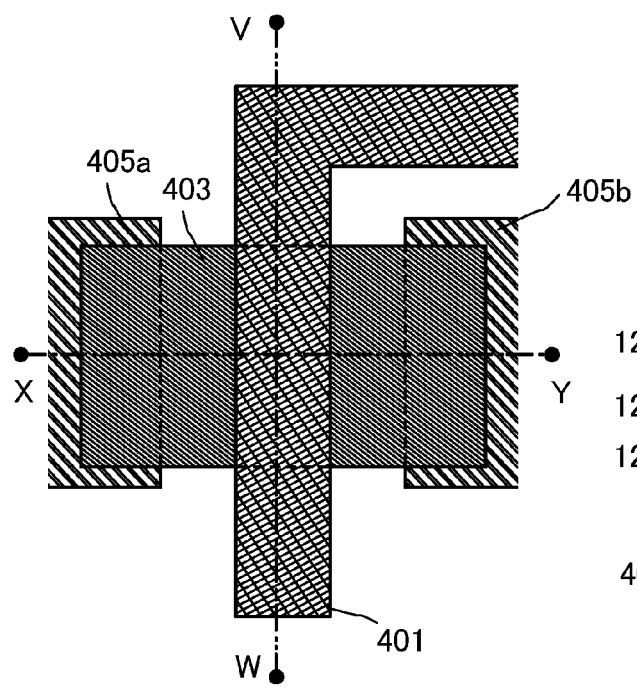
FIG. 3A is a plan view of a semiconductor device according to one embodiment of the present invention.
Figure 3C:
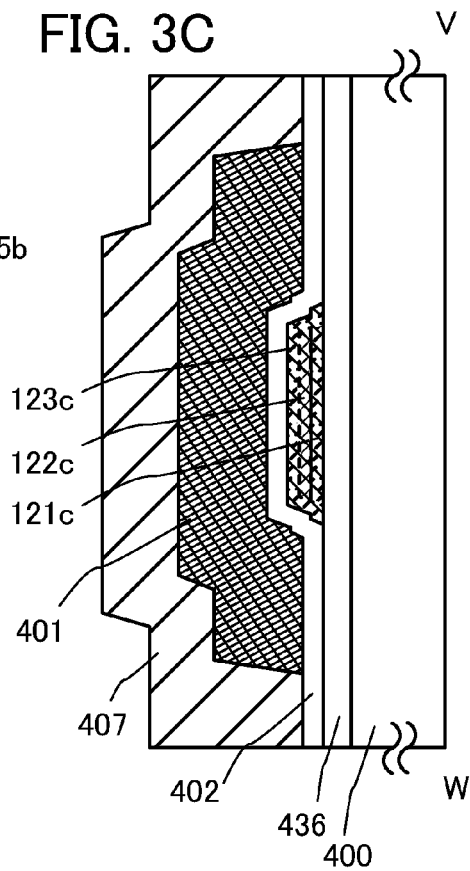
FIGS. 3B and 3C are cross-sectional views thereof.
Figure 3B:
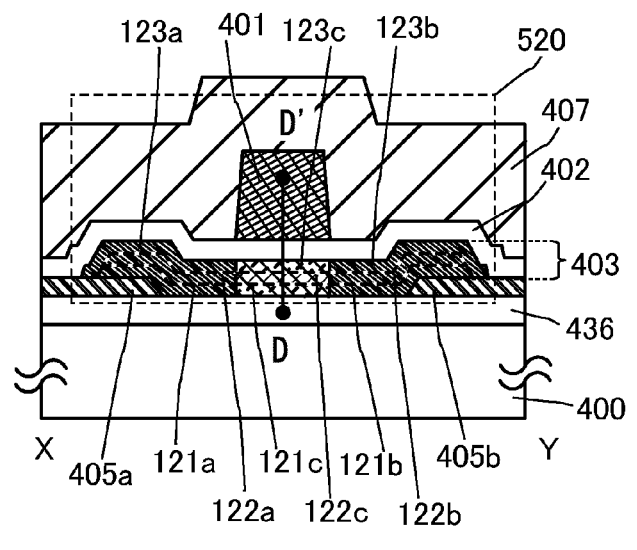

A transistor 520 illustrated in FIGS. 3A to 3C is an example of a top-gate transistor. FIG. 3A is a plan view, FIG. 3B is a cross-sectional view taken along chain line X-Y in FIG. 3A, and FIG. 3C is a cross-sectional view taken along chain line V-W in FIG. 3A.

As illustrated in FIG. 3B, which is a cross-sectional view in the channel length direction, the transistor 520 includes, over the substrate 400 which has an insulating surface and is provided with the oxide insulating film 436, the source electrode layer 405a, the drain electrode layer 405b, the oxide semiconductor stack 403 including a first oxide semiconductor layer, a second oxide semiconductor layer, and a third oxide semiconductor layer, the gate insulating film 402, and the gate electrode layer 401. The insulating film 407 is formed over the transistor 520.

In the transistor 520, the first oxide semiconductor layer is formed over and in contact with the oxide insulating film 436, the source electrode layer 405a, and the drain electrode layer 405b, and the second oxide semiconductor layer is formed over the first oxide semiconductor layer. Further, in the transistor 520, the oxide semiconductor stack 403 includes the third oxide semiconductor layer, and the third oxide semiconductor layer is provided to cover a side surface of the first oxide semiconductor layer and a side surface of the second oxide semiconductor layer. Note that a peripheral portion of the third oxide semiconductor layer in the channel length direction is in contact with the source electrode layer 405a and the drain electrode layer 405b.

In the oxide semiconductor stack 403, a channel formation region which overlaps with the gate electrode layer 401 with the gate insulating film 402 positioned therebetween includes three layers: a first channel formation region 121c, a second channel formation region 122c, and a third channel formation region 123c which are stacked in this order from the substrate 400 side.

In the channel length direction, first low-resistance regions 121a and 121b between which the first channel formation region 121c is sandwiched are provided. In the channel length direction, second low-resistance regions 122a and 122b between which the second channel formation region 122c is sandwiched are provided. In the channel length direction, third low-resistance regions 123a and 123b between which the third channel formation region 123c is sandwiched are provided.

In the oxide semiconductor stack 403 of the transistor 520 illustrated in FIGS. 3A to 3D, the first oxide semiconductor layer including the first low-resistance regions 121a and 121b and the first channel formation region 121c, the second oxide semiconductor layer including the second low-resistance regions 122a and 122b and the second channel formation region 122c, and the third oxide semiconductor layer including the third low-resistance regions 123a and 123b and the third channel formation region 123c are stacked in this order.

In addition, in the transistor 520, the second oxide semiconductor layer has a smaller energy gap than the first oxide semiconductor layer, and the third oxide semiconductor layer has a larger energy gap than the second oxide semiconductor layer. Note that the energy gap of the first oxide semiconductor layer is preferably equivalent to that of the third oxide semiconductor layer.

FIG. 3C is a cross-sectional view in the channel width direction, and as in FIG. 3B, end portions of the second oxide semiconductor layer are preferably covered with end portions of the third oxide semiconductor layer (i.e., side surfaces of the second low-resistance regions 122a and 122b are preferably covered with the third low-resistance regions 123a and 123b). With such a structure, generation of leakage current (parasitic channel) between the source electrode layer 405a and the drain electrode layer 405b of the transistor can be reduced. In FIG. 3C, the peripheral portion of the third oxide semiconductor layer in the channel width direction is in contact with the oxide insulating film 436.

Figure 3D:
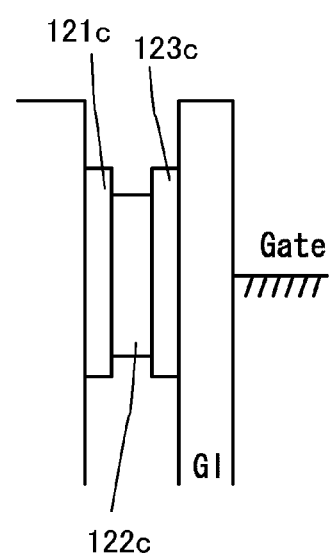
FIG. 3D is an energy band diagram thereof.

Further, FIG. 3D is an energy band diagram in the thickness direction (D-D') in FIG. 3B. In this embodiment, materials for the first oxide semiconductor layer, the second oxide semiconductor layer, and the third oxide semiconductor layer are selected in order to satisfy the energy band diagram of FIG. 3D. Note that when a buried channel is formed in a conduction band, sufficient effects can be obtained. Thus, an energy band diagram is not necessarily limited to that of FIG. 3D. That is, not both the conduction band and a valence band need to have a depression. For example, a structure may be formed so that only the conduction band has a depression.

For example, in the transistor 520, an In—Ga—Zn-based oxide film (energy gap: 3.2 eV) can be used as the first oxide semiconductor layer 101, an In—Sn—Zn-based oxide film (energy gap: 2.8 eV) can be used as the second oxide semiconductor layer 102, and an In—Ga—Zn-based oxide film (energy gap: 3.2 eV) can be used as a third oxide semiconductor layer 103.

Further, for the oxide semiconductor stack 403 having a three-layer structure as in the transistor 520, a structure in which an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103 are stacked; a structure in which a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103 are stacked; a structure in which a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103 are stacked; a structure in which an In—Ga-based oxide film serving as the first oxide semiconductor layer 101, an In—Ga—Zn-based oxide film serving as the second oxide semiconductor layer 102, and an In—Ga-based oxide film serving as the third oxide semiconductor layer 103 are stacked; or a structure in which an In—Ga—Zn-based oxide film serving as the first oxide semiconductor layer 101, an indium oxide (In-based oxide) film serving as the second oxide semiconductor layer 102, and an In—Ga—Zn-based oxide film serving as the third oxide semiconductor layer 103 are stacked can be used, for example.

With the structure in which the second oxide semiconductor layer 102 with a small energy gap is sandwiched between the first oxide semiconductor layer 101 and the third oxide semiconductor layer 103 with large energy gaps, the off-state current (leakage current) of the transistor 520 can be further reduced.

FIGS. 4A to 4D illustrate an example of a method for manufacturing the transistor 520.

First, as in Embodiment 1, the oxide insulating film 436, the source electrode layer 405a, and the drain electrode layer 405b are formed over the substrate 400 having an insulating surface. A first oxide semiconductor film and a second oxide semiconductor film are formed over the source electrode layer 405a and the drain electrode layer 405b and are processed into an island shape by a first photolithography process, so that the first oxide semiconductor layer 101 and the second oxide semiconductor layer 102 are formed.

Figure 4A:
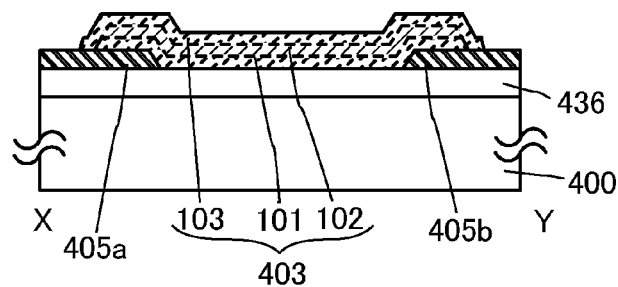
FIGS. 4A to 4D illustrate a method for manufacturing a semiconductor device according to one embodiment of the present invention.
Figure 4B:
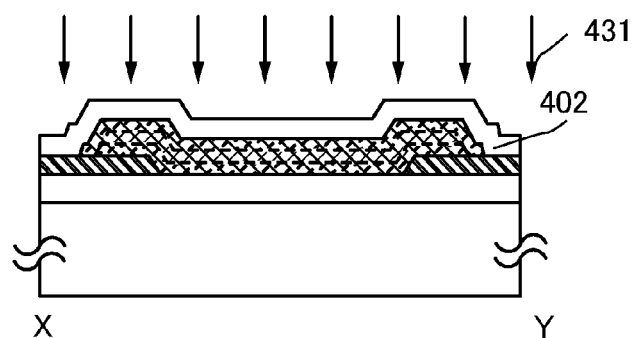
Figure 4C:
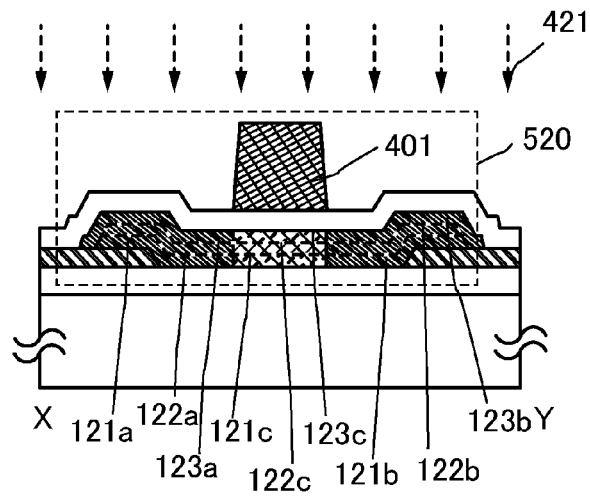

Next, a third oxide semiconductor film is formed over the second oxide semiconductor layer 102 so as to cover a side surface of the first oxide semiconductor layer 101 and a side surface of the second oxide semiconductor layer 102, and the third oxide semiconductor film is processed into an island shape by a second photolithography process, so that the third oxide semiconductor layer 103 is formed (see FIG. 4A). In this manner, the oxide semiconductor stack 403 including the first oxide semiconductor layer 101, the second oxide semiconductor layer 102, and the third oxide semiconductor layer 103 is formed.

The third oxide semiconductor layer 103 is preferably formed using the same target as the first oxide semiconductor layer 101. Formation conditions of the third oxide semiconductor layer 103 are the same as those of the first oxide semiconductor layer 101; thus, description thereof is omitted here. Note that by the second photolithography process, the third oxide semiconductor layer 103 which overlaps with the second oxide semiconductor layer 102 and has a top surface shape larger than the plan area of the second oxide semiconductor layer 102 is formed.

Then, heat treatment may be performed on the oxide semiconductor stack 403 in order to remove excess hydrogen (including water and a hydroxyl group) (to perform dehydration or dehydrogenation). Conditions of the heat treatment for dehydration or dehydrogenation are the same as those in the case of the transistor 510; thus, description thereof is omitted here.

Next, the gate insulating film 402 is formed to cover the source electrode layer 405a, the drain electrode layer 405b, and the oxide semiconductor stack 403. After that, oxygen 431 (including at least one of an oxygen radical, an oxygen atom, and an oxygen ion) is introduced into the oxide semiconductor stack 403 from above the gate insulating film 402, so that oxygen is supplied to at least the third oxide semiconductor layer 103 (see FIG. 4B). As a method for introducing oxygen, an ion implantation method, an ion doping method, a plasma immersion ion implantation method, plasma treatment, or the like can be used.

It is preferable that the introduction of oxygen into the oxide semiconductor stack 403 make the amount of oxygen contained in the oxide semiconductor stack 403 substantially exceed that in the stoichiometric ratio. For example, a peak of the concentration of oxygen introduced by the oxygen introduction treatment is preferably higher than or equal to $1 \times 10^{18}/cm^3$ and lower than or equal to $5 \times 10^{21}/cm^3$.

The oxygen 431 may be contained at least in an interface between the third oxide semiconductor layer 103 and the gate insulating film 402. Thus, depending on the depth at which the oxygen 431 is introduced, the oxygen concentrations in the first oxide semiconductor layer 101 and the second oxide semiconductor layer 102 are each equivalent to that in the stoichiometric ratio in some cases. The depth at which oxygen is introduced into the oxide semiconductor stack 403 may be controlled by appropriately setting an implantation condition such as acceleration voltage or a dose, or the thickness of the gate insulating film 402 through which oxygen passes.

The timing of the introduction of the oxygen 431 is not limited to after the formation of the gate insulating film 402. However, when oxygen is introduced through a film stacked over the oxide semiconductor stack 403, the depth at which oxygen is introduced (introduction region) is controlled easily, which enables efficient oxygen implantation into the oxide semiconductor stack 403.

In addition, heat treatment may be performed after the oxygen 431 is introduced. As for heating conditions, the heat treatment is preferably performed at a temperature higher than or equal to 250° C. and lower than or equal to 700° C., preferably higher than or equal to 300° C. and lower than or equal to 450° C., in an oxygen atmosphere. The heat treatment may be performed in a nitrogen atmosphere, a reduced-pressure atmosphere, or the air (ultra-dry air).

In the case where at least one layer in the oxide semiconductor stack 403 is a crystalline oxide semiconductor film, part of the crystalline oxide semiconductor film becomes amorphous in some cases by the introduction of the oxygen 431. In that case, the crystallinity may be recovered by performing heat treatment after the introduction of the oxygen 431.

Further, in the case where an oxygen-excess region is formed in the oxide semiconductor stack 403, an oxygen vacancy therein can be filled; thus, charge trapping centers in the oxide semiconductor stack 403 can be reduced. An oxygen vacancy exists in a portion where oxygen is eliminated in the oxide semiconductor stack 403, and a donor level which leads to a change in electric characteristics of a transistor is formed owing to the oxygen vacancy. Since an oxygen vacancy in the film can be filled by introduction of oxygen, with the use of such an oxide semiconductor stack for a transistor, variation in the threshold voltage Vth of the transistor owing to an oxygen vacancy and a shift of the threshold voltage ΔVth can be reduced. In addition, the threshold voltage can be positively shifted to make the transistor normally-off.

Next, the gate electrode layer 401 is formed over the gate insulating film 402 by a plasma CVD method, a sputtering method, or the like.

Next, treatment in which a dopant 421 is selectively introduced is preferably performed. In this treatment, with the use of the gate electrode layer 401 as a mask, the dopant 421 is introduced through the gate insulating film 402, so that the first low-resistance regions 121a and 121b, the second low-resistance regions 122a and 122b, and the third low-resistance regions 123a and 123b are formed (see FIG. 4C). Through this treatment, the first low-resistance regions 121a and 121b between which the first channel formation region 121c is sandwiched are formed in the channel length direction in a self-aligned manner. Further, the second low-resistance regions 122a and 122b between which the second channel formation region 122c is sandwiched are formed in the channel length direction in a self-aligned manner. Furthermore, the third low-resistance regions 123a and 123b between which the third channel formation region 123c is sandwiched are formed in the channel length direction in a self-aligned manner.

In the transistor 520 in this embodiment, the first low-resistance regions 121a and 121b, the second low-resistance regions 122a and 122b, and the third low-resistance regions 123a and 123b are regions containing the dopant and excess oxygen.

The low-resistance regions between which the channel formation region is sandwiched are formed in the channel length direction in the oxide semiconductor stack 403 by introducing the dopant 421, whereby on-state characteristics of the transistor 520 are improved; accordingly, high-speed operation and high-speed response of the transistor can be achieved. Further, the low-resistance regions are formed in a self-aligned manner and do not overlap with the gate electrode layer; thus, parasitic capacitance can be reduced. The reduction in parasitic capacitance leads to a reduction in the power consumption of the whole semiconductor device.

The treatment for introducing the dopant 421 may be controlled by appropriately setting an implantation condition such as acceleration voltage or a dose, or the thickness of the gate insulating film 402 through which the dopant 421 passes. For example, in the case where boron is used and boron ions are implanted by an ion implantation method, the dose may be greater than or equal to $1 \times 10^{13}$ ions/cm$^2$ and less than or equal to $5 \times 10^{16}$ ions/cm$^2$.

The concentrations of the dopant 421 in the first low-resistance regions 121a and 121b, the second low-resistance regions 122a and 122b, and the third low-resistance regions 123a and 123b are each preferably higher than or equal to $5 \times 10^{18}$/cm$^3$ and lower than or equal to $1 \times 10^{22}$/cm$^3$.

The dopant may be introduced while the substrate 400 is heated.

Note that the treatment in which the dopant 421 is introduced to form the first low-resistance regions 121a and 121b, the second low-resistance regions 122a and 122b, and the third low-resistance regions 123a and 123b may be performed plural times, and plural kinds of dopants may be used.

After the dopant 421 is introduced, heat treatment may be performed. As for heating conditions, the heat treatment is preferably performed at a temperature higher than or equal to 300° C. and lower than or equal to 700° C., preferably higher than or equal to 300° C. and lower than or equal to 450° C., for one hour in an oxygen atmosphere. The heat treatment may be performed in a nitrogen atmosphere, a reduced-pressure atmosphere, or the air (ultra-dry air).

In the case where at least one layer in the oxide semiconductor stack is a crystalline oxide semiconductor film, part of the crystalline oxide semiconductor film becomes amorphous in some cases by the introduction of the dopant 421. In that case, the crystallinity of the oxide semiconductor stack can be recovered by performing heat treatment after the introduction of the dopant 421.

In this embodiment, boron is used as the dopant. Thus, the first low-resistance regions 121a and 121b, the second low-resistance regions 122a and 122b, and the third low-resistance regions 123a and 123b contain boron and excess oxygen.

Through the above steps, the transistor 520 in this embodiment is manufactured.

Figure 4D:
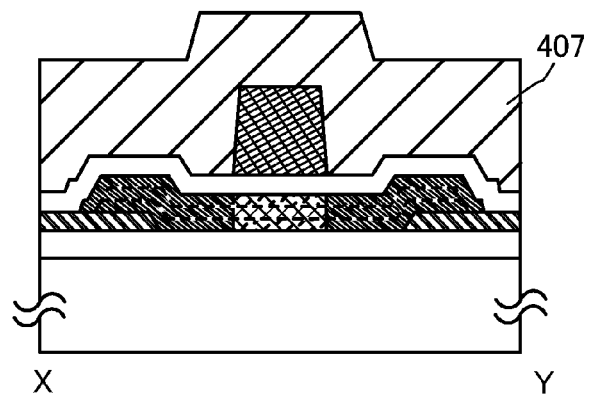

Note that the insulating film 407 may be formed to cover the transistor 520 (see FIG. 4D).

In the transistor 520 described in this embodiment, the third oxide semiconductor layer 103 is formed to cover the side surface of the first oxide semiconductor layer 101 and the side surface of the second oxide semiconductor layer 102. With such a structure, an increase in oxygen vacancies in the second oxide semiconductor layer 102 can be suppressed, and the threshold voltage of the transistor can be close to zero. Furthermore, the second oxide semiconductor layer 102 serves as a buried channel, which results in a reduction in carrier scattering. As a result, high field-effect mobility can be achieved.

Moreover, with the structure in which the second oxide semiconductor layer 102 with a small energy gap is sandwiched between the first oxide semiconductor layer 101 and the third oxide semiconductor layer 103 with large energy gaps, the off-state current (leakage current) of the transistor can be reduced.

Figure 5A:
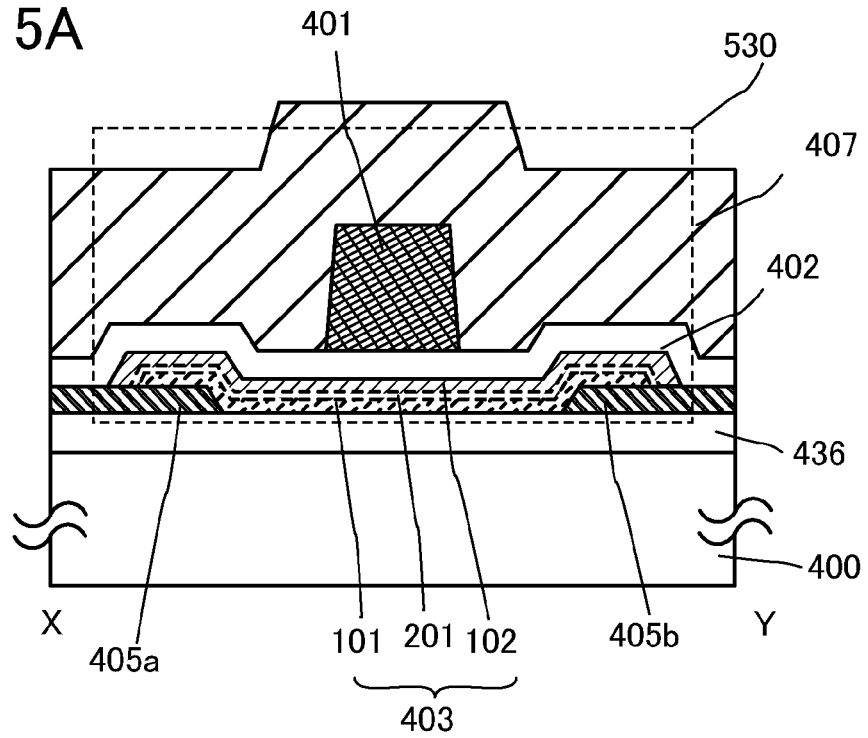
FIGS. 5A and 5B are each a cross-sectional view of a semiconductor device according to one embodiment of the present invention.
Figure 5B:
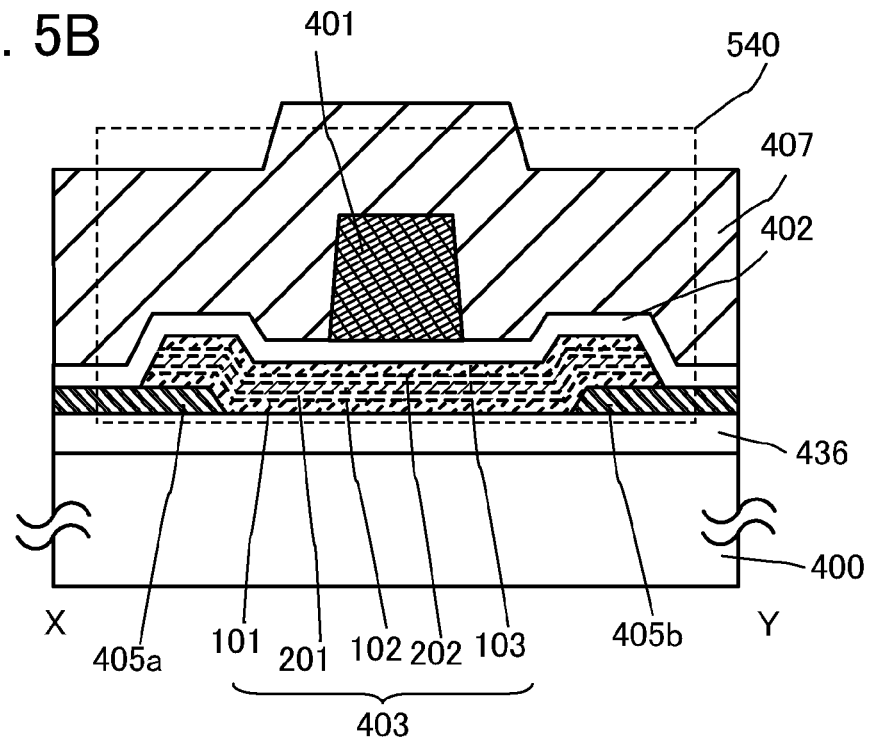

As described above, an interface between the oxide semiconductor layers included in the oxide semiconductor stack is unclear in some cases. When the interface is unclear, a portion which can be called a mixed region of a plurality of different oxide semiconductor layers is formed in some cases. FIGS. 5A and 5B illustrate a transistor 530 and a transistor 540, respectively, in each of which the oxide semiconductor stack 403 includes a mixed region.

The transistor 530 illustrated in FIG. 5A includes, over the substrate 400 which has an insulating surface and is provided with the oxide insulating film 436, the source electrode layer 405a, the drain electrode layer 405b, the oxide semiconductor stack 403 provided over the source electrode layer 405a and the drain electrode layer 405b, the gate insulating film 402, and the gate electrode layer 401. The insulating film 407 is formed over the transistor 530.

In the transistor 530, the oxide semiconductor stack 403 includes the first oxide semiconductor layer 101, the second oxide semiconductor layer 102, and a mixed region 201 between the first oxide semiconductor layer 101 and the second oxide semiconductor layer 102.

The mixed region 201 is a region where elements contained in the first oxide semiconductor layer 101 and the second oxide semiconductor layer 102 that are stacked are mixed, and at least the composition of elements contained in the mixed region is different from that of the elements contained in the first oxide semiconductor layer 101 and that of the elements contained in the second oxide semiconductor layer 102. For example, in the case where the oxide semiconductor stack 403 has a stacked structure of an oxide semiconductor layer containing indium, tin, and zinc and an oxide semiconductor layer containing indium, gallium, and zinc, the mixed region 201 containing indium, tin, gallium, and zinc can be formed between the first oxide semiconductor layer 101 and the second oxide semiconductor layer 102. In addition, even in the case where elements contained in the first oxide semiconductor layer 101 and the second oxide semiconductor layer 102 are the same, the mixed region 201 whose composition (composition ratio) is different from compositions of the first oxide semiconductor layer 101 and the second oxide semiconductor layer 102 can be formed. Thus, the energy gap of the mixed region 201 is also different from that of the first oxide semiconductor layer 101 and that of the second oxide semiconductor layer 102, and the energy gap of the mixed region 201 is a value between the energy gap of the first oxide semiconductor layer 101 and the energy gap of the second oxide semiconductor layer 102.

Thus, when the mixed region 201 is provided, a boundary between the first oxide semiconductor layer 101 and the second oxide semiconductor layer 102 is unclear, and an interface scattering in the oxide semiconductor stack 403 can be suppressed. That is, the transistor which is formed using the oxide semiconductor stack 403 provided with the mixed region 201 can have high field-effect mobility.

By providing the mixed region 201, a gradient can be formed between the first oxide semiconductor layer 101 and the second oxide semiconductor layer 102 in the energy band diagram. The shape of the gradient may have a plurality of steps.

The mixed region 201 can be formed by performing heat treatment on the oxide semiconductor stack after the first oxide semiconductor layer 101 and the second oxide semiconductor layer 102 are formed (or after the first oxide semiconductor film 191 and the second oxide semiconductor film 192 are formed). The heat treatment is performed at a temperature at which the elements in the first oxide semiconductor layer 101 and the second oxide semiconductor layer 102 can be diffused by heat under such a condition that the first oxide semiconductor layer 101 and the second oxide semiconductor layer 102 do not form a mixed region whose composition is uniform in the entire region of the oxide semiconductor stack 403.

The heat treatment can be performed in a reduced-pressure atmosphere, a nitrogen atmosphere, an oxygen atmosphere, the air (ultra-dry air), a rare gas atmosphere, or the like. The heat treatment may be performed more than once under different conditions (temperatures, atmospheres, times, or the like). For example, the first oxide semiconductor layer 101 and the second oxide semiconductor layer 102 are heated at 650° C. for one hour in a nitrogen atmosphere and further for one hour in an oxygen atmosphere; thus, the oxide semiconductor stack 403 including the mixed region 201 can be formed.

The step of performing the heat treatment for forming the mixed region 201 is not particularly limited as long as it is after the formation of the first oxide semiconductor film 191 and the second oxide semiconductor film 192, and may be performed on the first oxide semiconductor film 191 and the second oxide semiconductor film 192 in film form or on the island-shaped first oxide semiconductor layer 101 and second oxide semiconductor layer 102. In addition, the heat treatment can also serve as other heat treatment performed during the manufacturing process of the transistor, for example, heat treatment for dehydration or dehydrogenation or heat treatment for crystallization.

Further, in the transistor 530, the second oxide semiconductor layer 102 overlaps with the first oxide semiconductor layer 101 and has a larger area than the first oxide semiconductor layer 101, thereby covering the first oxide semiconductor layer 101. With such a structure, an increase in oxygen vacancies in the first oxide semiconductor layer 101 can be suppressed, and the threshold voltage of the transistor can be close to zero. Note that in the transistor 530, an aluminum oxide film is preferably formed as the oxide insulating film 436, whereby oxygen can be prevented from being released from the insulating film in contact with the first oxide semiconductor layer 101.

The transistor 540 illustrated in FIG. 5B includes, over the substrate 400 which has an insulating surface and is provided with the oxide insulating film 436, the source electrode layer 405a, the drain electrode layer 405b, the oxide semiconductor stack 403 provided over the source electrode layer 405a and the drain electrode layer 405b, the gate insulating film 402, and the gate electrode layer 401. The insulating film 407 is formed over the transistor 540.

In the transistor 540, the oxide semiconductor stack 403 includes the first oxide semiconductor layer 101, the second oxide semiconductor layer 102, the third oxide semiconductor layer 103, the mixed region 201 between the first oxide semiconductor layer 101 and the second oxide semiconductor layer 102, and a mixed region 202 between the second oxide semiconductor layer 102 and the third oxide semiconductor layer 103.

As in the case of the mixed region 201, the mixed region 202 is a region where elements contained in the second oxide semiconductor layer 102 and third oxide semiconductor layer 103 that are stacked are mixed, and at least the composition of elements contained in the mixed region 202 is different from that of the elements contained in the second oxide semiconductor layer 102 and that of the elements contained in the third oxide semiconductor layer 103. In addition, the energy gap of the mixed region 202 is a value between the energy gap of the second oxide semiconductor layer 102 and the energy gap of the third oxide semiconductor layer 103.

The mixed region 202 can be formed by heat treatment as in the case of the mixed region 201. Note that the mixed region 201 and the mixed region 202 can be formed by one heat treatment. In the transistor 540, the mixed region is provided both between the first oxide semiconductor layer 101 and the second oxide semiconductor layer 102 and between the second oxide semiconductor layer 102 and the third oxide semiconductor layer 103; however, one embodiment of the present invention is not limited to this structure. For example, in the oxide semiconductor stack 403 including the first to third oxide semiconductor layers, only the mixed region 201 may be provided between the first oxide semiconductor layer 101 and the second oxide semiconductor layer 102.

The transistor 540 illustrated in FIG. 5B has a structure in which the first oxide semiconductor layer 101, the second oxide semiconductor layer 102, and the third oxide semiconductor layer 103 are processed by performing a photolithography process once with the use of one mask, so that the oxide semiconductor stack 403 is formed. In the oxide semiconductor stack 403 included in the transistor 540, an end portion of the first oxide semiconductor layer 101, an end portion of the second oxide semiconductor layer 102, and an end portion of the third oxide semiconductor layer 103 are aligned; the three oxide semiconductor layers have the same shape. In other words, in the oxide semiconductor stack 403, a side surface (end portions) of the first oxide semiconductor layer 101 and a side surface (end portions) of the second oxide semiconductor layer 102 are exposed.

Formation of the oxide semiconductor stack 403 by performing a photolithography process once makes it possible to reduce the number of steps, and thus the cost of a semiconductor device can be reduced.

In the case of a structure in which the third oxide semiconductor layer 103 covers the side surface of the first oxide semiconductor layer 101 and the side surface of the second oxide semiconductor layer 102 as in the transistor 520 illustrated in FIG. 3B, the heat treatment for forming a mixed region might cause a mixed region (region where elements contained in the first oxide semiconductor layer 101 and the third oxide semiconductor layer 103 are mixed) to be formed between the side surface of the first oxide semiconductor layer 101 and the third oxide semiconductor layer 103.

The transistors 520, 530, and 540 described in this embodiment each include the oxide semiconductor stack 403 including a plurality of oxide semiconductor layers with energy gaps different from each other; therefore, electric characteristics of the transistors can be more accurately controlled. Accordingly, a transistor having desired electric characteristics can be obtained. By using the transistor, a semiconductor device which meets various purposes such as high performance, high reliability, and low power consumption can be provided.

The structures, methods, and the like described in this embodiment can be combined as appropriate with any of the structures, methods, and the like described in the other embodiments.

Embodiment 3

A semiconductor device having a display function (also referred to as a display device) can be manufactured using the transistor described in Embodiment 1 or 2. Moreover, some or all of driver circuits which include the transistor can be formed over a substrate where a pixel portion is formed, whereby a system-on-panel can be obtained.

Figure 6A:
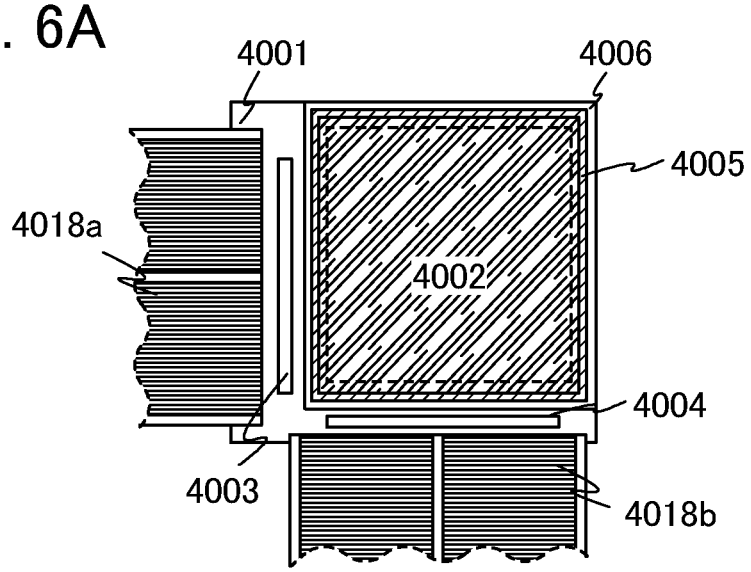
FIGS. 6A to 6C each illustrate a semiconductor device according to one embodiment of the present invention.

In FIG. 6A, a sealant 4005 is provided to surround a pixel portion 4002 provided over a first substrate 4001, and the pixel portion 4002 is sealed using a second substrate 4006. In FIG. 6A, a scan line driver circuit 4004 and a signal line driver circuit 4003 each of which is formed using a single crystal semiconductor film or a polycrystalline semiconductor film over a substrate separately prepared are mounted in regions that are different from the region surrounded by the sealant 4005 over the first substrate 4001. Various signals and potentials are supplied to the pixel portion 4002 through the signal line driver circuit 4003 and the scan line driver circuit 4004 from flexible printed circuits (FPCs) 4018a and 4018b.

Figure 6B:
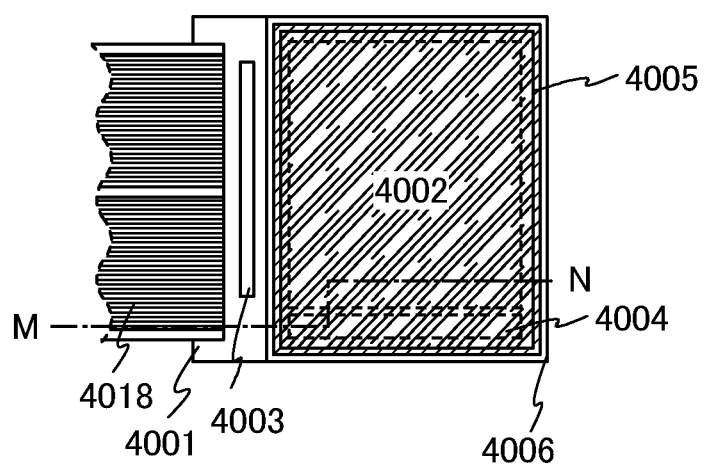
Figure 6C:
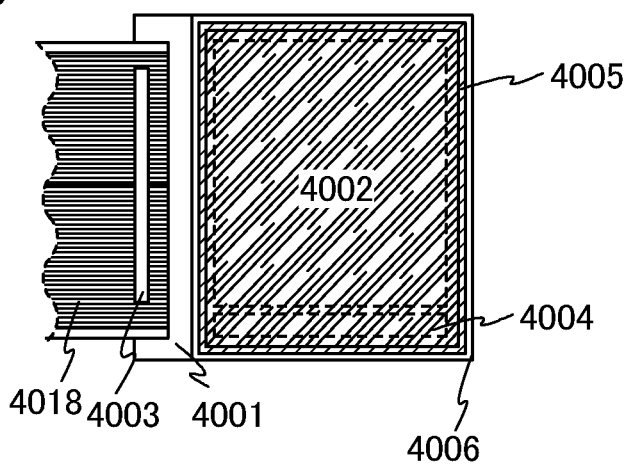

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 6B and 6C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 6B and 6C, various signals and potentials are supplied to the pixel portion 4002 through the signal line driver circuit 4003 and the scan line driver circuit 4004 from an FPC 4018.

Although FIGS. 6B and 6C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method for connecting a separately formed driver circuit, and a chip on glass (COG) method, a wire bonding method, a tape automated bonding (TAB) method, or the like can be used. FIG. 6A illustrates an example in which the signal line driver circuit 4003 and the scan line driver circuit 4004 are mounted by a COG method. FIG. 6B illustrates an example in which the signal line driver circuit 4003 is mounted by a COG method. FIG. 6C illustrates an example in which the signal line driver circuit 4003 is mounted by a TAB method.

Note that the display device includes a panel in which the display element is sealed, and a module in which an IC including a controller or the like is mounted on the panel.

Specifically, the display device in this specification means an image display device, a display unit, or a light source (including a lighting device). Furthermore, the display device includes not only a panel in which the display element is sealed but also the following modules: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, and the transistor described in Embodiment 1 or 2 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage and specifically includes an inorganic electroluminescent (EL) element, an organic EL element, and the like. Furthermore, a display medium whose contrast is changed by an electric effect, such as an electronic ink display device (electronic paper), can be used.

Figure 7A:
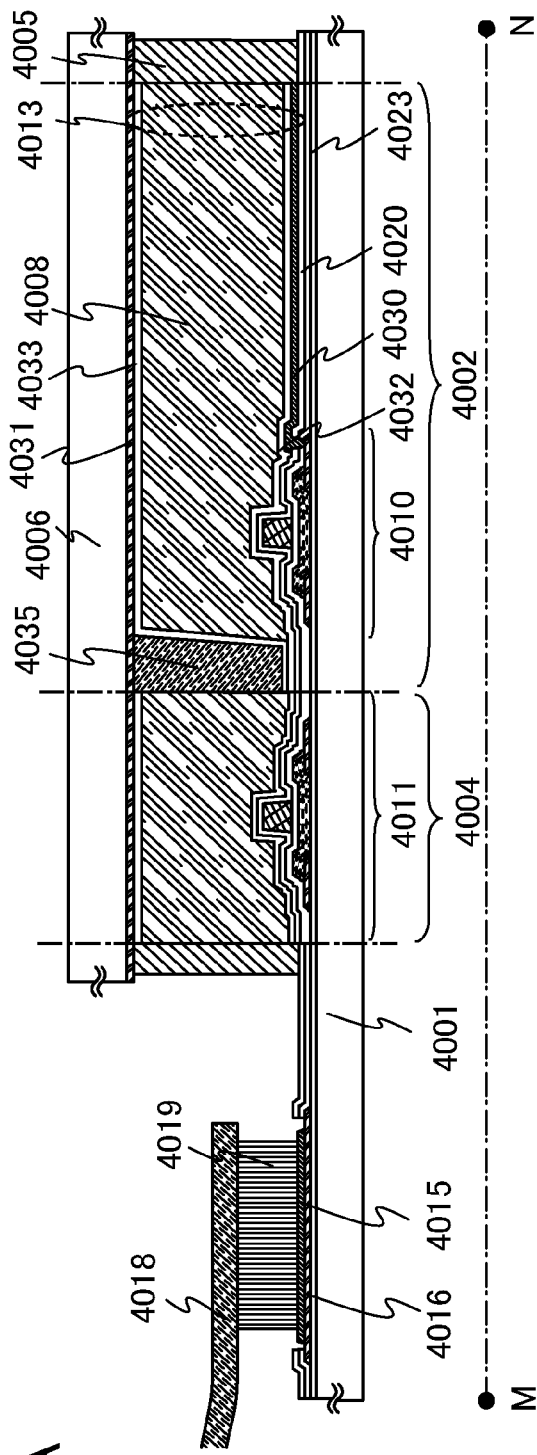
FIGS. 7A and 7B each illustrate a semiconductor device according to one embodiment of the present invention.
Figure 7B:
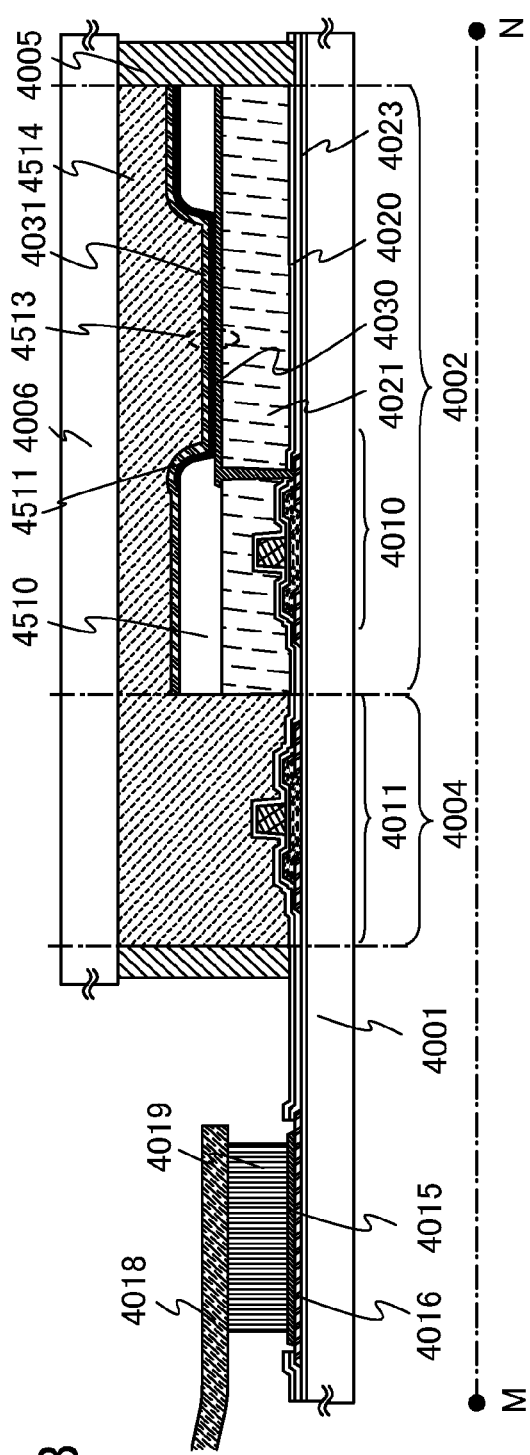

Embodiments of the semiconductor device are described with reference to FIGS. 6A to 6C and FIGS. 7A and 7B. FIGS. 7A and 7B are cross-sectional views along line M-N in FIG. 6B.

As illustrated in FIGS. 7A and 7B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source electrode layers and drain electrode layers of transistors 4010 and 4011.

The pixel portion 4002 and the scan line driver circuit 4004 which are provided over the first substrate 4001 include a plurality of transistors. FIG. 7A illustrates the transistor 4010 included in the pixel portion 4002 and the transistor 4011 included in the scan line driver circuit 4004 as an example. FIG. 7B also illustrates the transistor 4010 included in the pixel portion 4002 and the transistor 4011 included in the scan line driver circuit 4004 as an example. In FIG. 7A, an insulating film 4020 is provided over the transistors 4010 and 4011; in FIG. 7B, the insulating film 4020 and an insulating film 4021 are provided over the transistor 4010, and the insulating film 4020 is provided over the transistor 4011. Note that an insulating film 4023 is an insulating film functioning as a base film.

The transistor described in Embodiment 1 or 2 can be applied to the transistor 4010 and the transistor 4011. In this embodiment, an example is described in which a transistor having a structure similar to that of the transistor 520 described in Embodiment 2 is used.

The transistor 4010 and the transistor 4011 are each a transistor including a stack of at least two oxide semiconductor layers with energy gaps different from each other. By using such an oxide semiconductor stack for each of the transistor 4010 and the transistor 4011, electric characteristics of the transistors can be more accurately controlled and desired electric characteristics can be given to the transistors.

Therefore, a semiconductor device which meets various purposes such as high performance, high reliability, and low power consumption can be provided as the semiconductor device in this embodiment described with reference to FIGS. 6A to 6C and FIGS. 7A and 7B.

The transistor 4010 provided in the pixel portion 4002 is electrically connected to a display element to form a display panel. There is no particular limitation on the kind of display element as long as display can be performed, and various kinds of display elements can be employed.

FIG. 7A illustrates an example of a liquid crystal display device using a liquid crystal element as a display element. In FIG. 7A, a liquid crystal element 4013 includes the first electrode layer 4030, a second electrode layer 4031, and a liquid crystal layer 4008. Note that an insulating film 4032 and an insulating film 4033 which function as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 positioned therebetween.

A columnar spacer denoted by reference numeral 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystals may be either a compound with a low molecular weight or a polymer. Such a liquid crystal material (liquid crystal composition) exhibits a cholesteric phase, a smectic phase, a cubic phase, a chiral nematic phase, an isotropic phase, or the like, depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be improved.

The specific resistivity of the liquid crystal material is higher than or equal to $1 \times 10^9$ $\Omega \cdot cm$, preferably higher than or equal to $1 \times 10^{11}$ $\Omega \cdot cm$, further preferably higher than or equal to $1 \times 10^{12}$ $\Omega \cdot cm$. Note that the specific resistivity in this specification is measured at 20° C.

The size of a storage capacitor formed in the liquid crystal display device is set considering the leakage current of a transistor provided in the pixel portion or the like so that charge can be held for a predetermined period. The size of the storage capacitor may be set considering the off-state current of the transistor or the like. By using the transistor including the oxide semiconductor film disclosed in this specification, it is enough to provide a storage capacitor having a capacitance that is ⅓ or less, preferably ⅕ or less of the liquid crystal capacitance of each pixel.

In the transistor including the oxide semiconductor film disclosed in this specification, the current value in the off state (off-state current value) can be controlled to be small. Therefore, an electric signal such as an image signal can be held for a longer time and a writing interval can be set longer. Accordingly, frequency of refresh operation can be reduced, which leads to an effect of suppressing power consumption.

Further, in the transistor including the oxide semiconductor film disclosed in this specification, the field-effect mobility can be controlled to be high; thus, the scan line driver circuit 4004 can drive at high speed. According to this embodiment, a switching transistor in a pixel portion and a driver transistor used for a driver circuit portion can be formed over one substrate. That is, since a semiconductor device formed of a silicon wafer or the like is not additionally needed as a driver circuit, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an Advanced Super View (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element. Note that description is made here using an organic EL element as a light-emitting element.

In order to extract light emitted from the light-emitting element, at least one of the pair of electrodes has a light-transmitting property. The transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. A light-emitting element having any of these emission structures can be used.

FIG. 7B illustrates an example of a light-emitting device using a light-emitting element as a display element. A light-emitting element 4513 is electrically connected to the transistor 4010 provided in the pixel portion 4002. The structure of the light-emitting element 4513 is not limited to the stacked structure including the first electrode layer 4030, an electroluminescent layer 4511, and the second electrode layer 4031, which is illustrated in FIG. 7B. The structure of the light-emitting element 4513 can be changed as appropriate depending on the direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, and the like into the light-emitting element 4513. As the protective film, a silicon nitride film, a silicon nitride oxide film, a DLC film, or the like can be formed.

Further, a layer containing an organic compound may be formed by an evaporation method to cover the light-emitting element 4513 so that oxygen, hydrogen, moisture, carbon dioxide, and the like do not enter the light-emitting element 4513.

In addition, in a space which is formed with the first substrate 4001, the second substrate 4006, and the sealant 4005, a filler 4514 is provided for sealing. In this manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 4514, an ultraviolet curable resin or a thermosetting resin can be used as well as an inert gas such as nitrogen or argon. For example, poly(vinyl chloride) (PVC), an acrylic resin, polyimide, an epoxy resin, a silicone resin, poly(vinyl butyral) (PVB), or a copolymer of ethylene with vinyl acetate (EVA) can be used.

In addition, as needed, an optical film such as a polarizing plate, a circularly polarizing plate (including an elliptically polarizing plate), a retardation plate (quarter-wave plate or half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as an electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

A dispersion of the above microcapsules in a solvent is referred to as electronic ink. By use of a color filter or particles that have a pigment, color display is possible as well.

As the electronic paper, a display device using a twisting ball display system can be used. The twisting ball display system refers to a method in which spherical particles each colored in black and white are arranged between a first electrode layer and a second electrode layer that are electrode layers used for a display element, and a potential difference is generated between the first electrode layer and the second electrode layer to control the orientation of the spherical particles, so that display is performed.

In FIGS. 6A to 6C and FIGS. 7A and 7B, as the first substrate 4001 and the second substrate 4006, flexible substrates, for example, plastic substrates having a light-transmitting property can be used as well as glass substrates. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. In this embodiment, the aluminum oxide film provided as the insulating film 4020 over the oxide semiconductor film has a high shielding effect (blocking effect), which is not permeable to either oxygen or impurities such as hydrogen and moisture. Therefore, during and after the manufacturing process, the aluminum oxide film functions as a protective film for preventing entry of impurities such as hydrogen and moisture, which can cause a change, into the oxide semiconductor film and release of oxygen, which is a main component of the oxide semiconductor, from the oxide semiconductor film.

Further, the insulating film 4021 functioning as a planarization insulating film can be formed using an organic material having heat resistance, such as an acrylic resin, polyimide resin, a benzocyclobutene-based resin, polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of any of these materials.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or graphene.

The first electrode layer 4030 and the second electrode layer 4031 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A protection circuit for protecting the driver circuit may be provided. The protection circuit is preferably formed using a nonlinear element.

As described above, by using the transistor described in Embodiment 1 or 2, a semiconductor device having a variety of functions can be provided.

Embodiment 4

A semiconductor device having an image sensor function of reading information on an object can be manufactured with the use of the transistor described in Embodiment 1 or 2.

Figure 8A:
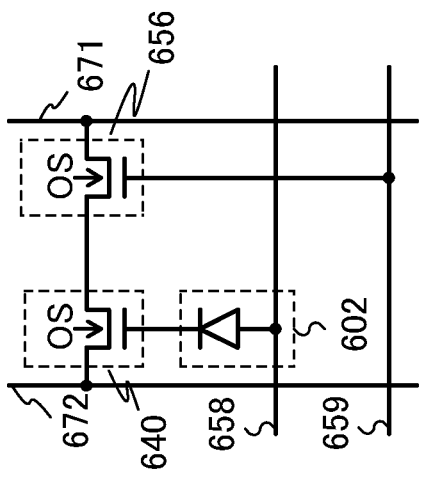
FIGS. 8A and 8B illustrate a semiconductor device according to one embodiment of the present invention.

FIG. 8A illustrates an example of a semiconductor device having an image sensor function. FIG. 8A is an equivalent circuit diagram of a photo sensor, and FIG. 8B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in the circuit diagram in this specification, a transistor including an oxide semiconductor film is denoted by a symbol "OS" so that it can be identified as a transistor formed using an oxide semiconductor film. In FIG. 8A, the transistor 640 and the transistor 656 are each a transistor formed using an oxide semiconductor stack, to which the transistor described in Embodiment 1 or 2 can be applied. In this embodiment, an example is described in which a transistor having a structure similar to that of the transistor 520 described in Embodiment 2 is used.

Figure 8B:
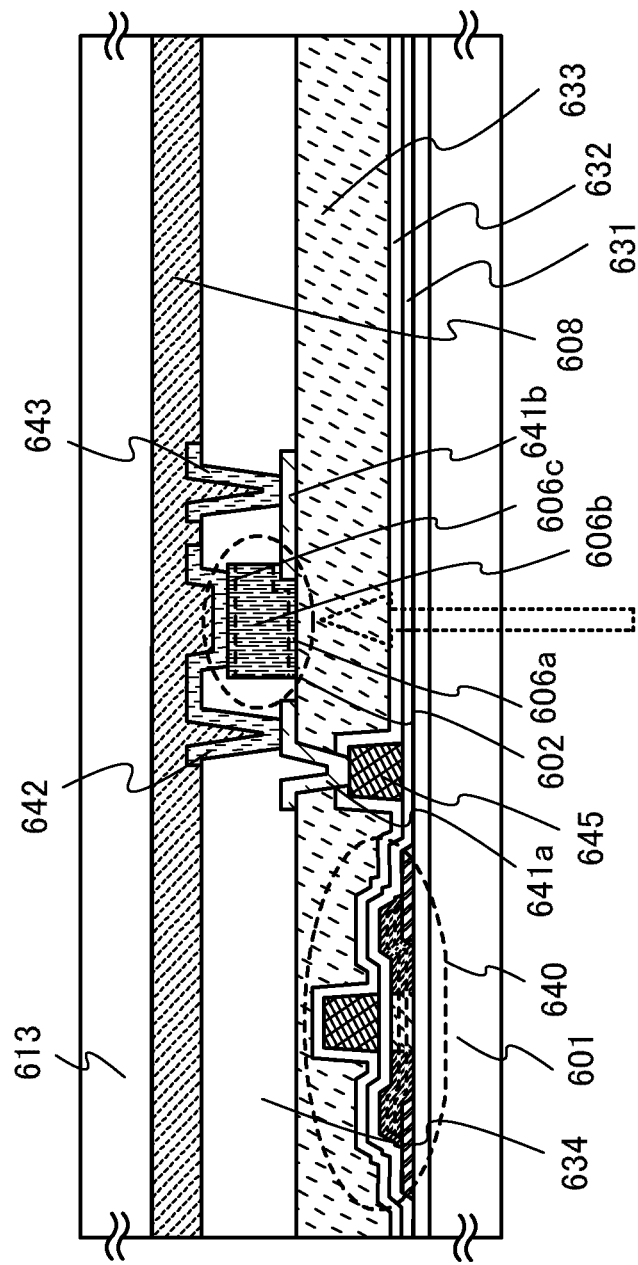

FIG. 8B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrode layers 641a and 641b provided over the interlayer insulating film 633 and an electrode layer 642 provided over the interlayer insulating film 634.

The electrode layer 641b is electrically connected to a conductive layer 643 through a contact hole provided in the interlayer insulating film 634, and the electrode layer 642 is electrically connected to an electrode layer 645 through the electrode layer 641a. The electrode layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heat treatment or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heat treatment or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light approaching the semiconductor film having a conductivity type opposite to that of the semiconductor film on the light-receiving plane is disturbance light; therefore, the electrode layer is preferably formed using a light-blocking conductive film. Note that the n-type semiconductor film side may alternatively be a light-receiving plane.

With the use of an insulating material, the insulating film 632, the interlayer insulating film 633, and the interlayer insulating film 634 can be formed, depending on the material, by a sputtering method, a plasma CVD method, an SOG method, spin coating, dipping, spray coating, a droplet discharge method (such as an inkjet method), screen printing, offset printing, or the like.

In this embodiment, an aluminum oxide film is used as an insulating film 631. The insulating film 631 can be formed by a sputtering method or a plasma CVD method.

The aluminum oxide film provided as the insulating film 631 over an oxide semiconductor film has a high shielding effect (blocking effect), which is not permeable to either oxygen or impurities such as hydrogen and moisture.

Therefore, during and after the manufacturing process, the aluminum oxide film functions as a protective film for preventing entry of impurities such as hydrogen and moisture, which can cause a change, into the oxide semiconductor film and release of oxygen, which is a main component of the oxide semiconductor, from the oxide semiconductor film.

The insulating film 632 can be formed using an inorganic insulating material and can have a single-layer structure or a stacked structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance, such as polyimide resin, an acrylic resin, a benzocyclobutene-based resin, polyamide resin, or an epoxy resin, can be used. Other than such organic insulating materials, it is also possible to use a single layer or stacked layers of any of a low-dielectric constant material (low-k material), a siloxane-based resin, phosphosilicate glass (PSG), borophosphosilicate glass (BPSG), and the like.

With detection of light that enters the photodiode 602, information on an object to be detected can be read. Note that a light source such as a backlight can be used at the time of reading information on an object to be detected.

As described above, by using an oxide semiconductor stack including a plurality of oxide semiconductor layers with energy gaps different from each other as a semiconductor layer, electric characteristics of a transistor can be more accurately controlled and desired electric characteristics can be given to the transistor. Therefore, by using the transistor, a semiconductor device which meets various purposes such as high performance, high reliability, and low power consumption can be provided.

This embodiment can be implemented in appropriate combination with any of the structures described in the other embodiments.

Embodiment 5

A semiconductor device disclosed in this specification can be applied to a variety of electronic devices (including game machines). Examples of electronic devices include a television device (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), and a game console. Specific examples of these electronic devices are illustrated in FIGS. 9A to 9D.

Figure 9A:
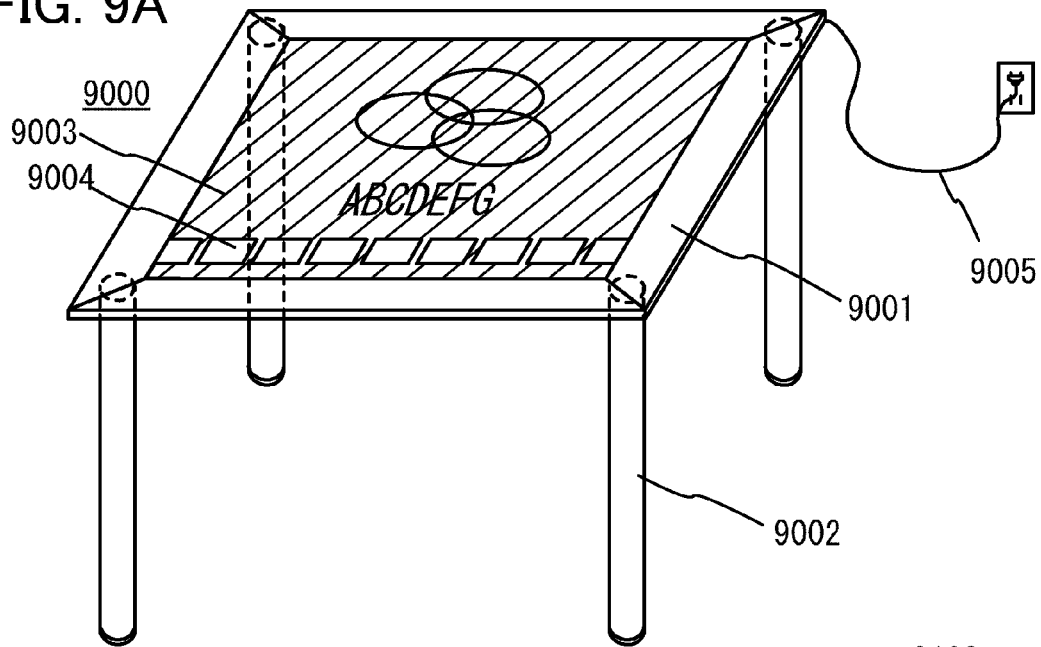
FIGS. 9A to 9D each illustrate an electronic device.

FIG. 9A illustrates a table 9000 having a display portion. In the table 9000, a display portion 9003 is incorporated in a housing 9001. A semiconductor device manufactured according to one embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch input function. When a user touches displayed buttons 9004 which are displayed on the display portion 9003 of the table 9000 with his/her finger or the like, the user can operate the screen and input information. Further, when communication with or control of another home appliance is possible, the display portion 9003 may function as a control device for controlling the home appliance by operation of the screen. For example, with the use of the semiconductor device having an image sensor function described in Embodiment 4, the display portion 9003 can have a touch input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 9B:
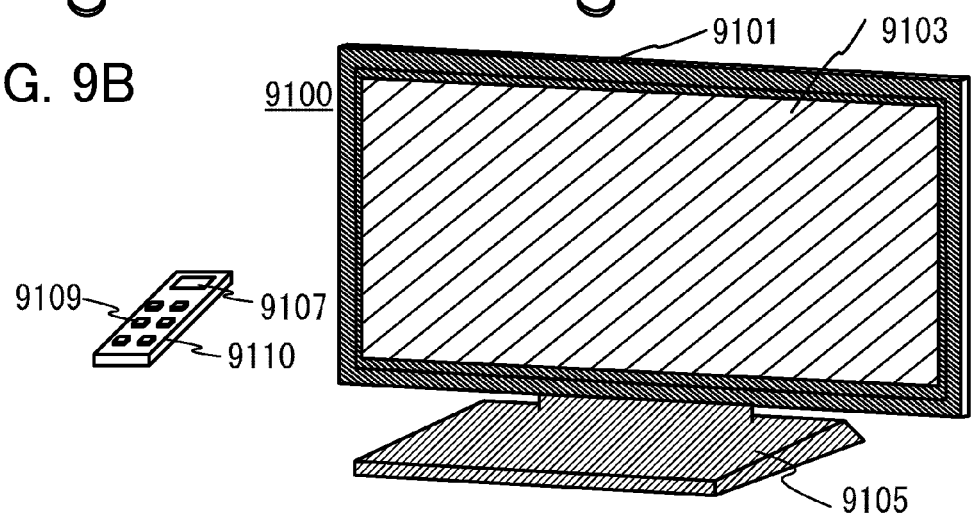

FIG. 9B illustrates a television set 9100. In the television set 9100, a display portion 9103 is incorporated in a housing 9101. A semiconductor device manufactured according to one embodiment of the present invention can be used for the display portion 9103, and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver, between receivers, or the like) data communication can be performed.

When the semiconductor device including a buried channel described in the above embodiment is used for the display portion 9103 of the television set, the television set can have higher display quality than a conventional one.

Figure 9C:
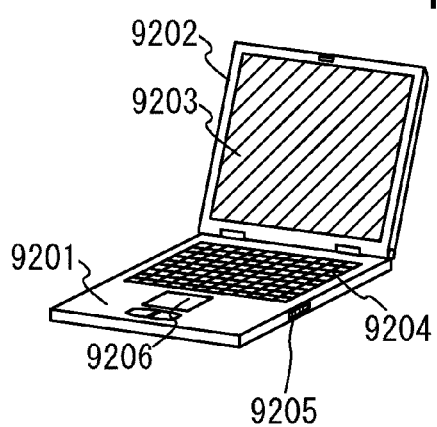

FIG. 9C illustrates a computer which includes a main body 9201, a housing 9202, a display portion 9203, a keyboard 9204, an external connection port 9205, a pointing device 9206, and the like. The computer is obtained using a semiconductor device manufactured according to one embodiment of the present invention for the display portion 9203.

Further, when the semiconductor device described in the above embodiment is used for the display portion 9203 of the computer, the display portion can have higher display quality than a conventional one.

Figure 9D:
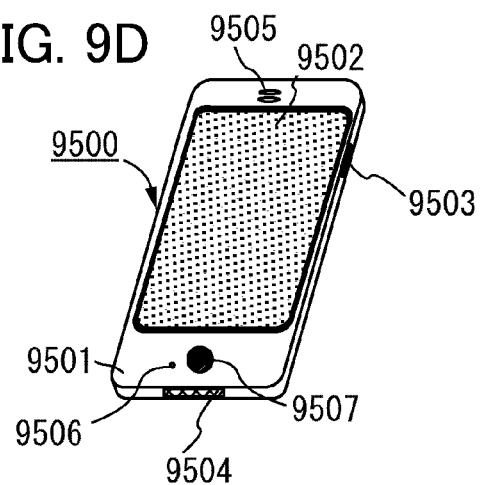

FIG. 9D illustrates an example of a mobile phone. A mobile phone 9500 is provided with a display portion 9502 incorporated in a housing 9501, an operation button 9503, an operation button 9507, an external connection port 9504, a speaker 9505, a microphone 9506, and the like. The mobile phone 9500 is obtained using a semiconductor device manufactured according to one embodiment of the present invention for the display portion 9502.

A user can input data, make a call, or compose a message by touching the display portion 9502 of the mobile phone 9500 illustrated in FIG. 9D with his/her finger or the like.

There are mainly three screen modes for the display portion 9502. The first mode is a display mode mainly for displaying images. The second mode is an input mode mainly for inputting data such as text. The third mode is a mode in which two modes of the display mode and the input mode are combined.

For example, in the case of making a call or composing a message, the input mode mainly for inputting text is selected for the display portion 9502 so that characters displayed on the screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. The screen mode can also be switched depending on the kind of image displayed on the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed for a specified period of time while a signal is detected by an optical sensor in the display portion 9502, the screen mode may be controlled so as to be switched from the input mode to the display mode.

The display portion 9502 can also function as an image sensor. For example, an image of a palm print, a fingerprint, or the like is taken when the display portion 9502 is touched with the palm or the finger, whereby personal authentication can be performed. Further, by providing a backlight or a sensing light source which emits near-infrared light in the display portion, an image of a finger vein, a palm vein, or the like can be taken.

The structures, methods, and the like described in this embodiment can be combined as appropriate with any of the structures, methods, and the like described in the other embodiments.

Example 1

In this example, Samples (Sample 1A, Sample 1B, Sample 2A, and Sample 2B) were manufactured in which a second oxide semiconductor layer whose energy gap is smaller than that of a first oxide semiconductor layer is formed over the first oxide semiconductor layer and a third oxide semiconductor layer is formed over the second oxide semiconductor layer, and cross-sectional structures of Sample 1A, Sample 1B, Sample 2A, and Sample 2B were observed. Further, ionization potentials of Samples 1A and 2A were measured, based on which the energy band diagrams were obtained by calculation. In this specification, the value of the ionization potential corresponds to the sum of the band gap and the electron affinity, and the value of the band gap is a value obtained by measuring a single material film with a spectroscopic ellipsometer.

A 5-nm-thick In—Ga—Zn—O film, a 5-nm-thick In—Sn—Zn—O film, and a 5-nm-thick In—Ga—Zn—O film were stacked over a quartz substrate, which is a substrate 1000, as a first oxide semiconductor layer 1001, a second oxide semiconductor layer 1002, and a third oxide semiconductor layer 1003, respectively, to form Sample 1A. These films were formed by a sputtering method at a substrate temperature of 300° C. in an oxygen atmosphere (the proportion of oxygen was 100%). An oxide target with an atomic ratio of In:Ga:Zn=1:1:1 was used as a target to form the In—Ga—Zn—O film. Further, an oxide target with an atomic ratio of In:Sn:Zn=2:1:3 was used to form the In—Sn—Zn—O film.

An oxide semiconductor stack formed in a manner similar to that of Sample 1A was subjected to heat treatment, so that an oxide semiconductor stack including a mixed region was formed as Sample 1B. The heat treatment was performed at 650° C. in a nitrogen atmosphere for one hour, and then performed at 650° C. in an oxygen atmosphere for one hour.

A 5-nm-thick In—Ga—Zn—O film, a 5-nm-thick In—Zn—O film, and a 5-nm-thick In—Ga—Zn—O film were stacked over a quartz substrate, which is the substrate 1000, as the first oxide semiconductor layer 1001, the second oxide semiconductor layer 1002, and the third oxide semiconductor layer 1003, respectively, to form Sample 2A. These films were formed by a sputtering method at a substrate temperature of 300° C. in an oxygen atmosphere (the proportion of oxygen was 100%). An oxide target with an atomic ratio of In:Ga:Zn=1:1:1 was used as a target to form the In—Ga—Zn—O film. Further, an oxide target with an atomic ratio of In:Zn=2:1 was used to form the In—Zn—O film.

An oxide semiconductor stack formed in a manner similar to that of Sample 2A was subjected to heat treatment, so that an oxide semiconductor stack including a mixed region was formed as Sample 2B. The heat treatment was performed at 650° C. in a nitrogen atmosphere for one hour, and then performed at 650° C. in an oxygen atmosphere for one hour.

Figure 10A:
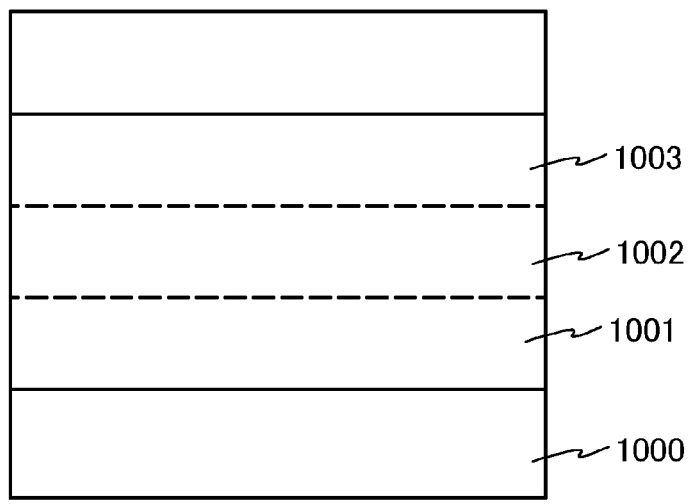
FIG. 10A is a schematic view of an example sample.
Figure 10B:
FIGS. 10B and 10C are TEM images of example samples.
Figure 10C:
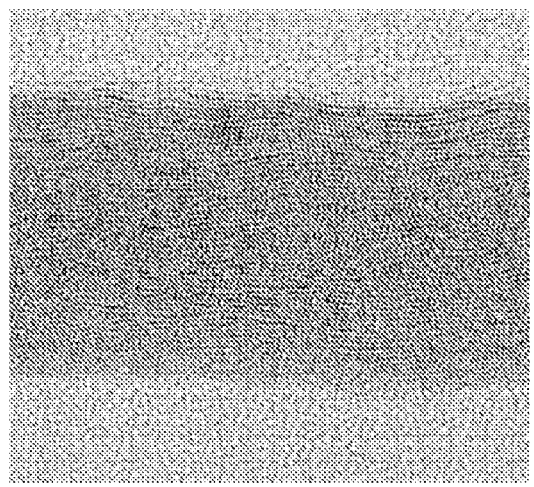
Figure 11A:
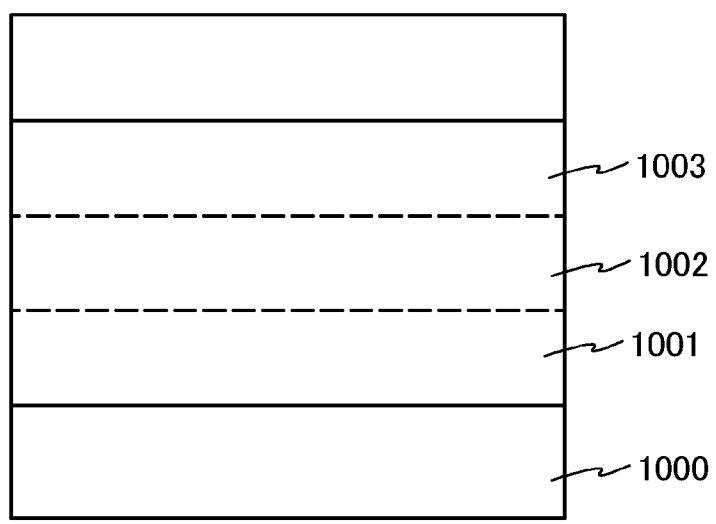
FIG. 11A is a schematic view of an example sample.
Figure 11B:
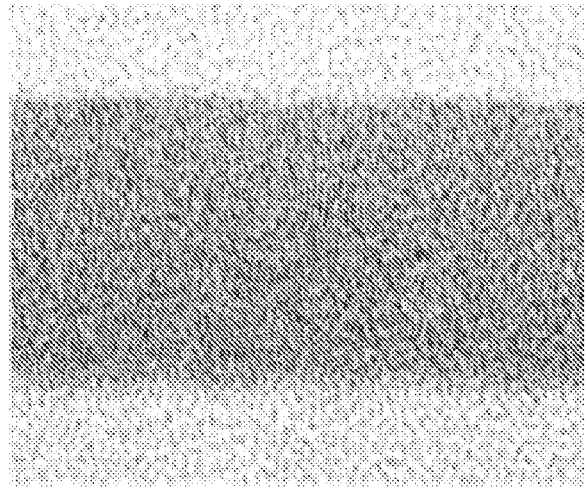
FIGS. 11B and 11C are TEM images of example samples.
Figure 11C:
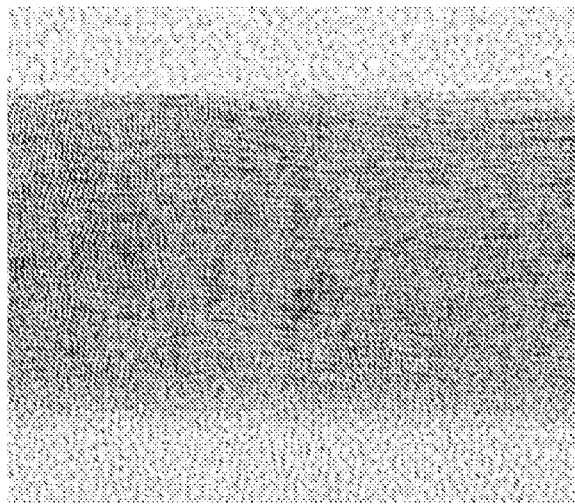

Respective edge sections were cut out of Samples 1A, 1B, 2A, and 2B, and cross sections thereof were observed with a high-resolution transmission electron microscope (TEM) ("H9000-NAR", manufactured by Hitachi High-Technologies Corporation) at an acceleration voltage of 300 kV. FIG. 10B is a TEM image of Sample 1A; FIG. 10C is a TEM image of Sample 1B; FIG. 11B is a TEM image of Sample 2A; FIG. 11C is a TEM image of Sample 2B. A schematic diagram of Sample 1A and a schematic diagram of Sample 2A are FIG. 10A and FIG. 11A, respectively. Each interface between stacked oxide semiconductor layers is schematically shown by a dotted line in FIG. 10A and FIG. 11A.

The TEM images of Samples 1A and 1B in FIGS. 10B and 10C are of the oxide semiconductor stack in which the 5-nm-thick first In—Ga—Zn—O film, the 5-nm-thick In—Sn—Zn—O film, and the 5-nm-thick second In—Ga—Zn—O film were stacked over the substrate 1000 as the first oxide semiconductor layer 1001, the second oxide semiconductor layer 1002, and the third oxide semiconductor layer 1003, respectively. Each interface between the stacked oxide semiconductor layers can be recognized in the TEM image of Sample 1A in FIG. 10B. On the other hand, in the TEM image of Sample 1B in which the heat treatment was performed on the oxide semiconductor stack, a clear interface is not recognized between the stacked oxide semiconductor layers as shown in FIG. 10C, and a mixed region is formed.

The TEM images of Samples 2A and 2B in FIGS. 11B and 11C are of the oxide semiconductor stack in which the 5-nm-thick first In—Ga—Zn—O film, the 5-nm-thick In—Zn—O film, and the 5-nm-thick second In—Ga—Zn—O film were stacked over the substrate 1000 as the first oxide semiconductor layer 1001, the second oxide semiconductor layer 1002, and the third oxide semiconductor layer 1003, respectively. Each interface between the stacked oxide semiconductor layers can be recognized in the TEM image of Sample 2A in FIG. 11B. On the other hand, in the TEM image of Sample 2B in which the heat treatment was performed on the oxide semiconductor stack, a clear interface is not recognized between the stacked oxide semiconductor layers as shown in FIG. 11C, and a mixed region is formed.

As shown in FIGS. 10B and 10C and FIGS. 11B and 11C, it can be recognized that in Samples 1A, 1B, 2A, and 2B, the first In—Ga—Zn—O film which is the first oxide semiconductor layer 1001, the In—Sn—Zn—O film and the In—Zn—O film each of which is the second oxide semiconductor layer 1002, and the second In—Ga—Zn—O film which is the third oxide semiconductor layer 1003 each include a crystal and are each a CAAC-OS film. The first In—Ga—Zn—O film which is the first oxide semiconductor layer 1001 also includes an amorphous structure.

The crystal state of each oxide semiconductor layer in the oxide semiconductor stack is not particularly limited; each and every oxide semiconductor layer may have a crystal structure or may have an amorphous structure, or both an oxide semiconductor layer having a crystal structure and an oxide semiconductor layer having an amorphous structure may be included in the oxide semiconductor stack.

Figure 12:
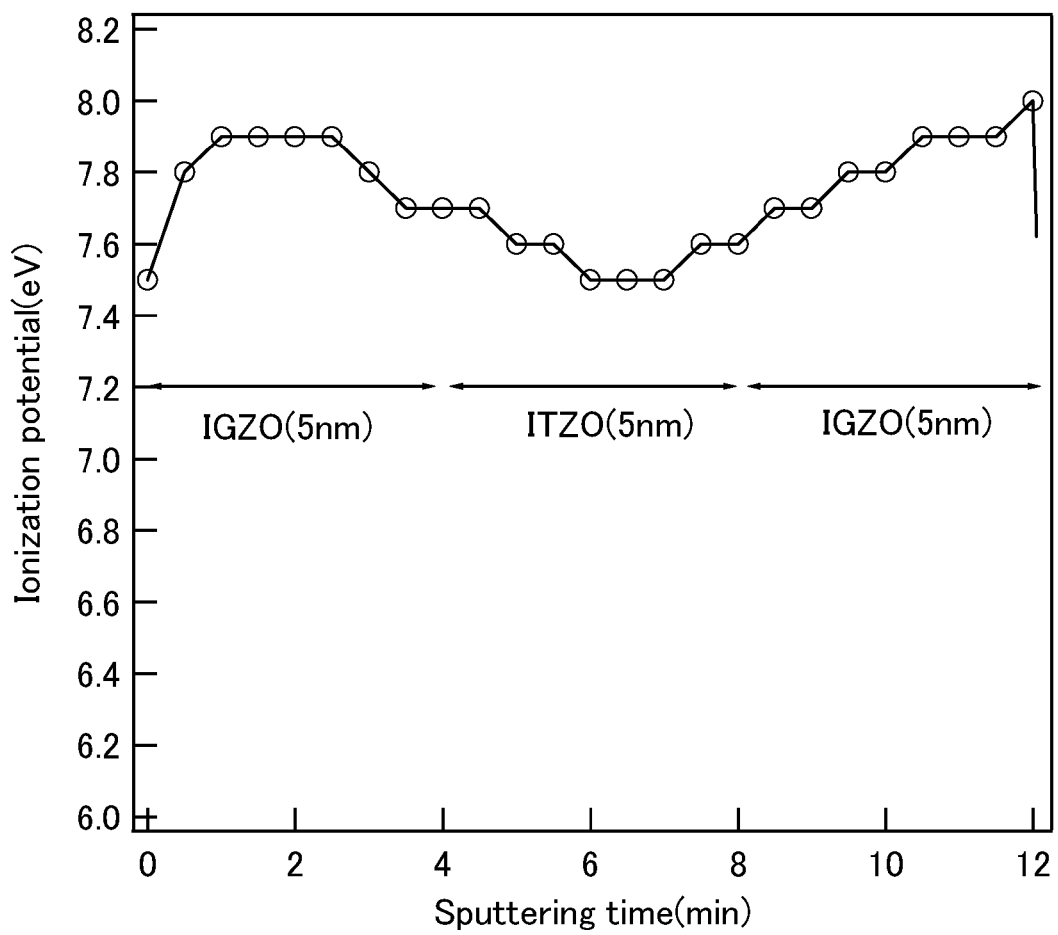
FIG. 12 shows a result of ionization potential measurement.
Figure 14:
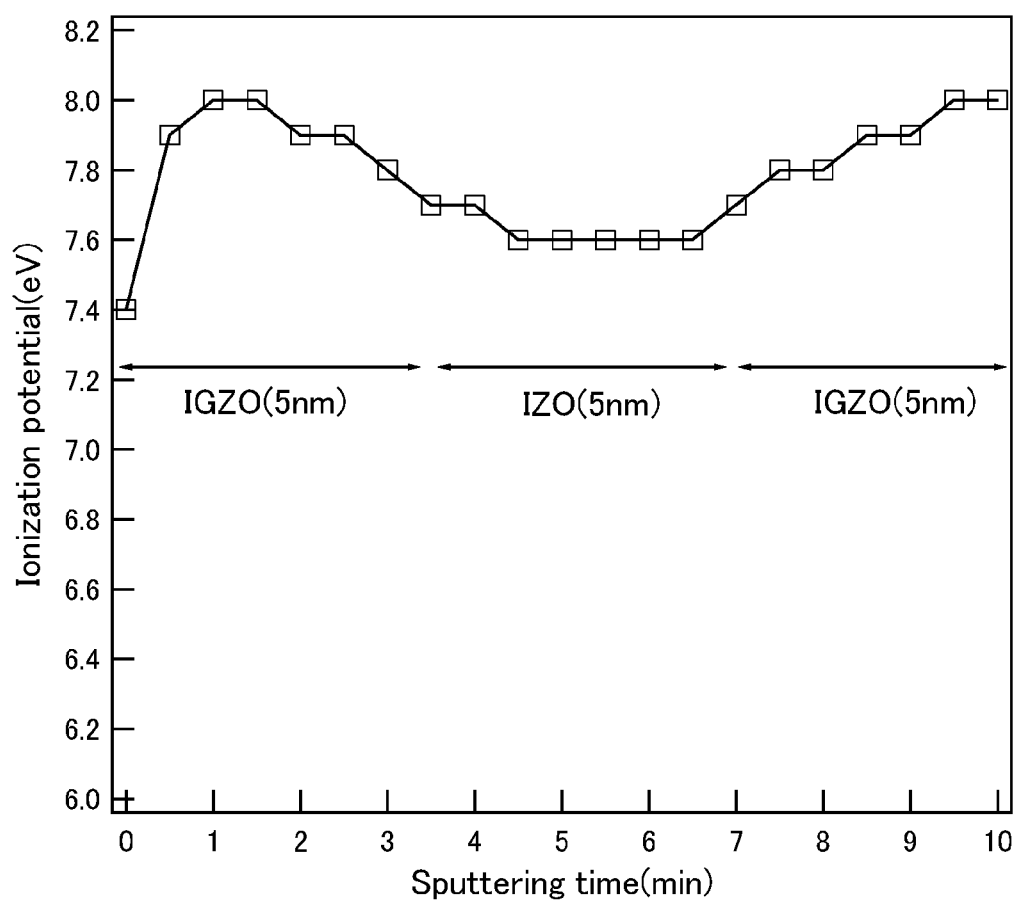
FIG. 14 shows a result of ionization potential measurement.

Stacks were formed under the respective film formation conditions which are the same as those of Sample 1A and Sample 2A except a single crystal silicon substrate being used as a substrate, and ionization potentials thereof were measured by ultraviolet photoelectron spectroscopy (UPS) while sputtering top surfaces thereof, results of which are shown in FIG. 12 and FIG. 14.

In FIG. 12 and FIG. 14, the horizontal axis represents the time of sputtering conducted from the surface side of the sample and the vertical axis represents the ionization potential. Borders between the films in the samples are indicated on the assumption that the sputtering rate of the In—Ga—Zn—O film is equal to that of the In—Sn—Zn—O film, and that the sputtering rate of the In—Ga—Zn—O film is equal to that of the In—Zn—O film.

According to FIG. 12, the ionization potential of the In—Sn—Zn—O film which is sandwiched between the In—Ga—Zn—O films is lowered. Note that the ionization potential corresponds to an energy difference between a vacuum level and a valence band.

Figure 13:
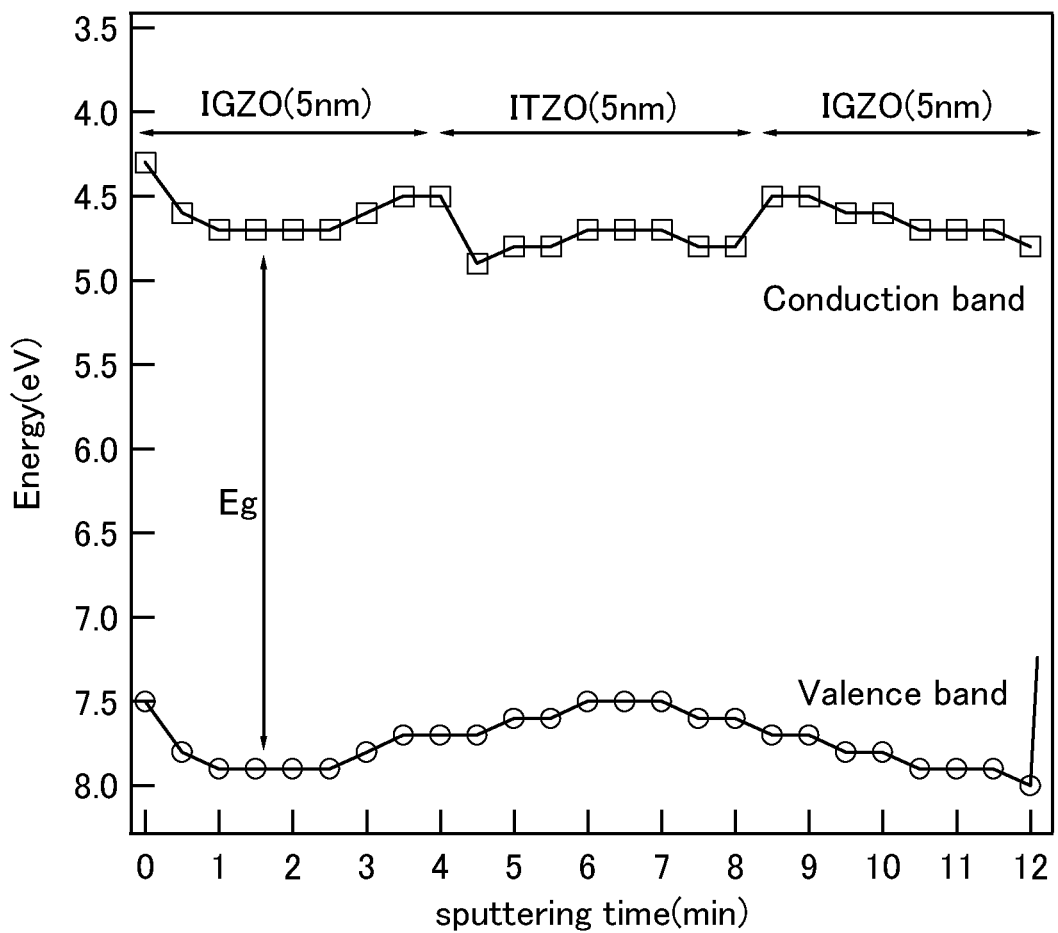
FIG. 13 is an energy band diagram.

The energy of the conduction band was obtained by subtracting the band gap measured with a spectroscopic ellipsometer from the value of the ionization potential, and the band structure of the stacked films was formed. Note that the band gap of the In—Ga—Zn—O film was 3.2 eV, and the band gap of the In—Sn—Zn—O film was 2.8 eV. FIG. 13 shows the result. FIG. 13 indicates that a buried channel is formed as in the energy band diagram of FIG. 3D.

According to FIG. 14, the ionization potential of the In—Zn—O film which is sandwiched between the In—Ga—Zn—O films is lowered. Note that the ionization potential corresponds to an energy difference between a vacuum level and a valence band.

Figure 15:
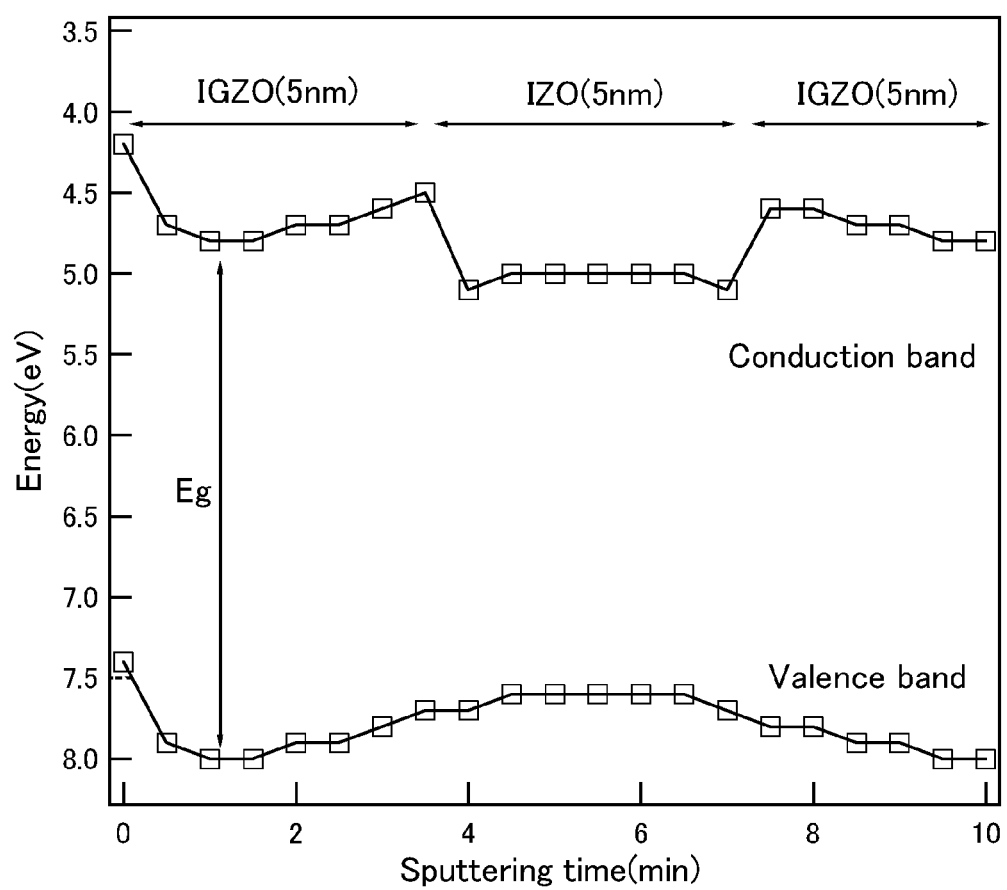
FIG. 15 is an energy band diagram.

The energy of the conduction band was obtained by subtracting the band gap measured with a spectroscopic ellipsometer from the value of the ionization potential, and the band structure of the stacked films was formed. Note that the band gap of the In—Ga—Zn—O film was 3.2 eV, and the band gap of the In—Zn—O film was 2.6 eV. FIG. 15 shows the result. FIG. 15 indicates that a buried channel is formed as in the energy band diagram of FIG. 3D.

According to this example, as an energy band diagram, FIG. 13, FIG. 15, or FIG. 3D can be applied to the stack in which In—Ga—Zn—O films are used as the first oxide semiconductor layer and the third oxide semiconductor layer, and an In—Sn—Zn—O film or an In—Zn—O film is used as the second oxide semiconductor layer having a lower ionization potential and a smaller energy gap than the first oxide semiconductor layer and the third oxide semiconductor layer. There is no particular limitation on the combination of materials for the first oxide semiconductor layer, the second oxide semiconductor layer, and the third oxide semiconductor layer; in consideration of energy gaps of materials to be used, the materials may be selected and combined as appropriate by practitioners in order to satisfy the energy band diagram of FIG. 13, FIG. 15, or FIG. 3D.

Example 2

In this example, characteristics of a transistor having the same structure as the transistor 510 in Embodiment 1 were calculated, which included an oxide semiconductor stack including a first oxide semiconductor layer and a second oxide semiconductor layer.

For calculation in this example, simulation software Technology Computer-Aided Design (TCAD) manufactured by Synopsys, Inc. was used.

The transistor used for the calculation was a top-gate transistor which included an oxide semiconductor stack including a first oxide semiconductor layer provided over a source electrode layer and a drain electrode layer and a second oxide semiconductor layer provided over the first oxide semiconductor layer, and a 100-nm-thick gate insulating film provided over the oxide semiconductor stack. The calculation was conducted with each of the L length and the W length set to 10 μm and the drain voltage (Vd) set to 1 V.

As for the structure of the oxide semiconductor stack included in the transistor, the following four samples were prepared: Transistor A including a 5-nm-thick In—Sn—Zn—O film as the first oxide semiconductor layer and a 5-nm-thick In—Ga—Zn—O film as the second oxide semiconductor layer; Transistor B including a 5-nm-thick In—Ga—Zn—O film as the first oxide semiconductor layer and a 5-nm-thick In—Sn—Zn—O film as the second oxide semiconductor layer; Transistor C, which was a comparative example, including a 5-nm-thick In—Ga—Zn—O film as the first oxide semiconductor layer and a 5-nm-thick In—Ga—Zn—O film as the second oxide semiconductor layer (i.e., the oxide semiconductor stack consisted of the In—Ga—Zn—O films); and Transistor D, which was a comparative example, including a 5-nm-thick In—Sn—Zn—O film as the first oxide semiconductor layer and a 5-nm-thick In—Sn—Zn—O film as the second oxide semiconductor layer (i.e., the oxide semiconductor stack consisted of the In—Sn—Zn—O films).

The calculation was conducted setting the band gap of each of the In—Ga—Zn—O films included in Transistors A to C to 3.15 eV, the carrier lifetime thereof to 1 nanosecond, the bulk mobility thereof to 10 cm$^2$/Vs, and the electron affinity thereof to 4.6 eV. The calculation was conducted setting the band gap of each of the In—Sn—Zn—O films included in Transistors A, B, and D to 2.8 eV, the carrier lifetime thereof to 1 nanosecond, the bulk mobility thereof to 35 cm$^2$/Vs, and the electron affinity thereof to 4.6 eV.

Figure 16A:
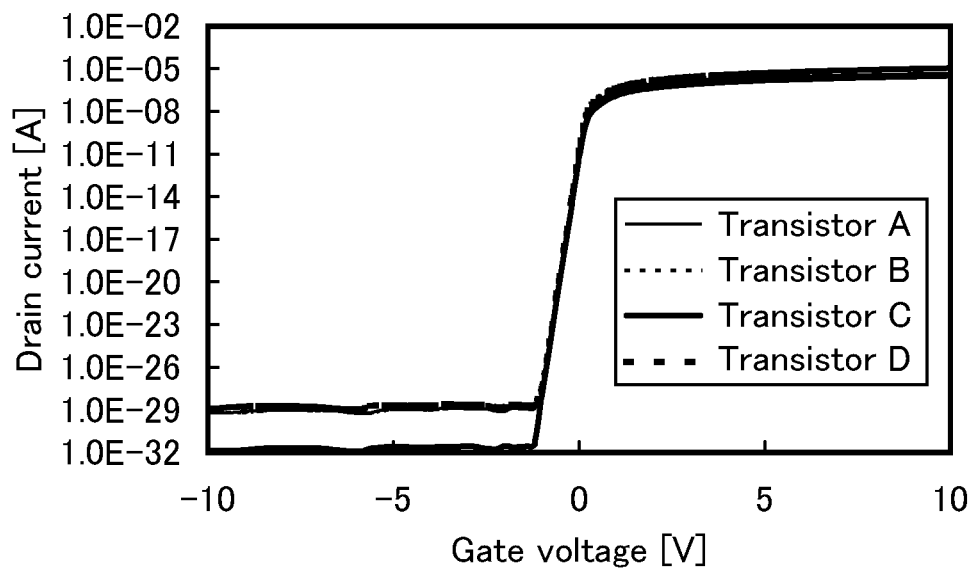
FIGS. 16A and 16B show calculated off-state current characteristics of transistors.
Figure 16B:
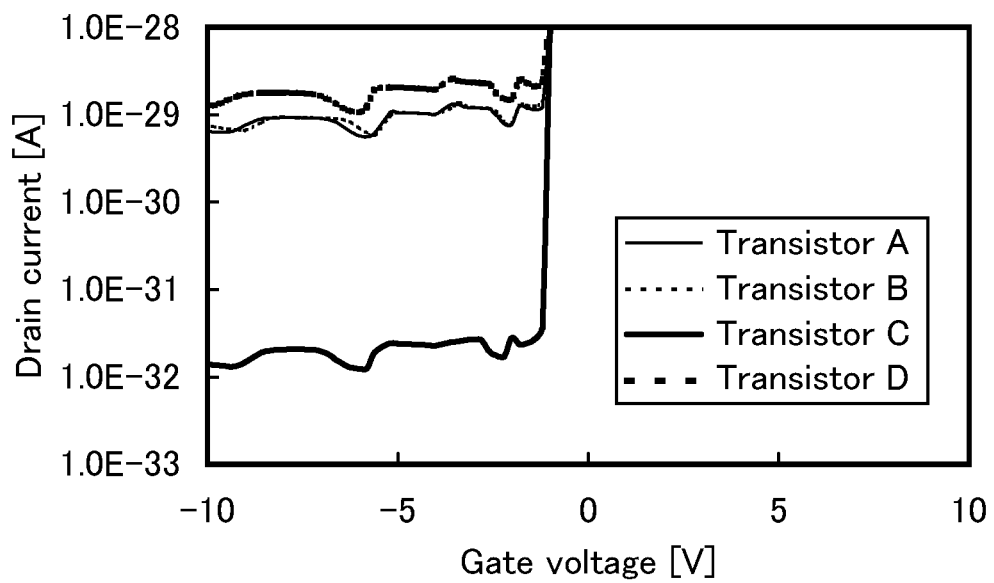

The off-state current values obtained by the calculation are shown in FIGS. 16A and 16B. Note that FIG. 16B is a graph in which the range of drain current from $1.0 \times 10^{-33}$ A to $1.0 \times 10^{-28}$ A in FIG. 16A is enlarged. In FIGS. 16A and 16B, the vertical axis represents the drain current (A) and the horizontal axis represents the gate voltage (V).

Figure 17:
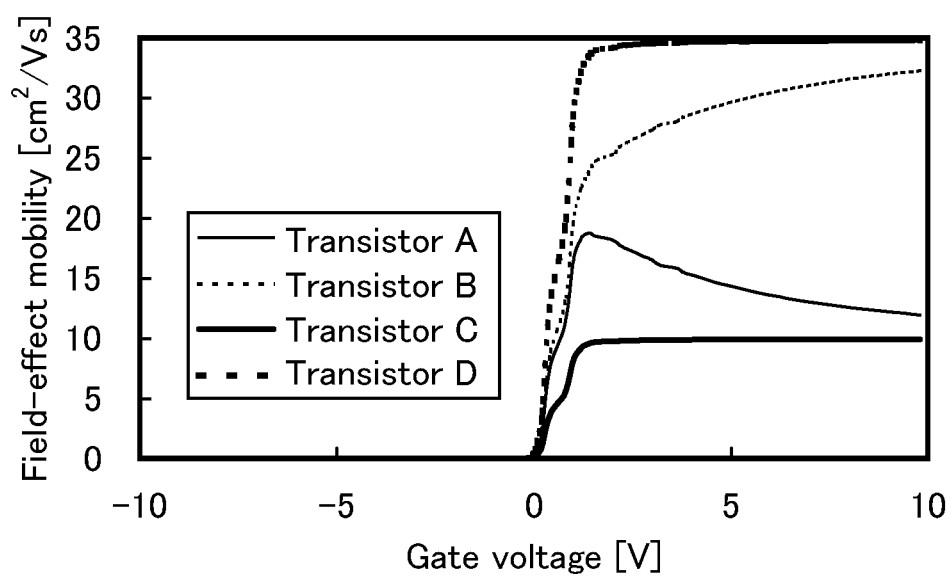
FIG. 17 shows calculated field effect mobility of transistors.

The field-effect mobility of the transistors, which was obtained by the calculation, is shown in FIG. 17. In FIG. 17, the vertical axis represents the field-effect mobility (cm$^2$/Vs) and the horizontal axis represents the gate voltage (V).

FIGS. 16A and 16B and FIG. 17 show that Transistor D, which is a comparative example, has a larger off-state current value than the other three samples while having high field-effect mobility. In addition, Transistor C, which is a comparative sample, has low field-effect mobility and small on-state current while having favorable off-state current characteristics. In contrast, Transistor A and Transistor B, which are example transistors, have smaller off-state current values than Transistor D and higher field-effect mobility than Transistor C.

Specifically, the off-state current value of Transistor C was approximately $1.3 \times 10^{-29}$ A to $2.0 \times 10^{-32}$ A, whereas the off-state current value of Transistor A was approximately $0.6 \times 10^{-29}$ A and the off-state current value of Transistor B was approximately $0.6 \times 10^{-29}$ A. The field-effect mobility of Transistor D was approximately 35 cm$^2$/Vs, whereas the field-effect mobility of Transistor A was approximately 15 cm$^2$/Vs to 20 cm$^2$/Vs and the field-effect mobility of Transistor B was approximately 25 cm$^2$/Vs to 30 cm$^2$/Vs.

Note that the field-effect mobility of Transistor B was higher than that of Transistor A. It is presumable that this is because, in Transistor B, the In—Sn—Zn—O film with high field-effect mobility was in contact with the gate insulating film as the second oxide semiconductor layer and a channel was formed in the In—Sn—Zn—O film.

The above results indicate that characteristics (field-effect mobility and off-state current characteristics in this example) of a transistor including an oxide semiconductor stack can be variously changed depending on the stacked condition in the oxide semiconductor stack. Accordingly, with the use of the oxide semiconductor stack, the electric characteristics of the transistor can be more accurately controlled and desired electric characteristics can be given to the transistor.

This application is based on Japanese Patent Application serial no. 2011-152190 filed with the Japan Patent Office on Jul. 8, 2011, the entire contents of which are hereby incorporated by reference.

What is claimed is:
1. A semiconductor device comprising:
a substrate having an insulating surface;
a source electrode layer and a drain electrode layer over the substrate;
a first oxide semiconductor layer over the source electrode layer and the drain electrode layer;
a second oxide semiconductor layer over the first oxide semiconductor layer;
a gate insulating layer over the second oxide semiconductor layer; and
a gate electrode layer overlapping with the oxide semiconductor layer with the gate insulating layer interposed therebetween,
wherein the first oxide semiconductor layer comprises a stack of a first oxide semiconductor film and a second oxide semiconductor film,
wherein the first oxide semiconductor film and the second oxide semiconductor film each include crystals,
wherein an energy gap of the first oxide semiconductor film is different from an energy gap of the second oxide semiconductor film, and
wherein the second oxide semiconductor layer covers and is in contact with side surfaces of the first oxide semiconductor film and side surfaces of the second oxide semiconductor film.

2. The semiconductor device according to claim 1,
wherein the energy gap of the first oxide semiconductor film is larger than or equal to 3 eV, and
wherein the energy gap of the second oxide semiconductor film is smaller than 3 eV.

3. The semiconductor device according to claim 1, wherein the first and second oxide semiconductor layers includes an impurity region, and wherein the impurity region does not overlap with the gate electrode layer.

4. The semiconductor device according to claim 1, wherein c-axes of crystals are aligned in a direction perpendicular to a surface of the first and second oxide semiconductor layers.

5. A semiconductor device comprising:
a substrate having an insulating surface;
a source electrode layer and a drain electrode layer formed over the substrate;
a first oxide semiconductor layer over the source electrode layer and the drain electrode layer;
a second oxide semiconductor layer over the first oxide semiconductor layer;
a gate insulating layer over the second oxide semiconductor layer; and
a gate electrode layer overlapping with the second oxide semiconductor layer with the gate insulating layer interposed therebetween,
wherein the first oxide semiconductor layer comprises a stack of a first oxide semiconductor film and a second oxide semiconductor film,
wherein an energy gap of the first oxide semiconductor film is different from an energy gap of the second oxide semiconductor film, and
wherein the second oxide semiconductor layer covers and is in contact with side surfaces of the first oxide semiconductor film and side surfaces of the second oxide semiconductor film.

6. The semiconductor device according to claim 5,
wherein the energy gap of the first oxide semiconductor film is larger than or equal to 3 eV, and
wherein the energy gap of the second oxide semiconductor film is smaller than 3 eV.

7. The semiconductor device according to claim 5,
wherein the second oxide semiconductor layer comprises a third oxide semiconductor film, and
wherein an energy gap of the third oxide semiconductor film is equal to the energy gap of the first oxide semiconductor film.

8. The semiconductor device according to claim 7,
wherein the second oxide semiconductor film is interposed between the first oxide semiconductor film and the third oxide semiconductor film.

9. The semiconductor device according to claim 5,
wherein the second oxide semiconductor layer includes an impurity region, and
wherein the impurity region does not overlap with the gate electrode layer.

10. The semiconductor device according to claim 5,
wherein the first oxide semiconductor layer includes crystals, and
wherein c-axes of the crystals are aligned in a direction perpendicular to a surface of the first oxide semiconductor layer.

11. A method for manufacturing a semiconductor device, comprising the steps of:
forming a source electrode layer and a drain electrode layer over an oxide insulating film;
forming a first oxide semiconductor layer over the source electrode layer and the drain electrode layer;
forming a second oxide semiconductor layer over the first oxide semiconductor layer;
forming a gate insulating layer over the source electrode layer, the drain electrode layer, and the second oxide semiconductor layer; and
forming a gate electrode layer overlapping with the first oxide semiconductor layer and the second oxide semiconductor layer with the gate insulating layer interposed therebetween,
wherein the first oxide semiconductor layer comprises a stack of a first oxide semiconductor film and a second oxide semiconductor film,
wherein the first oxide semiconductor film and the second oxide semiconductor film each include crystals,
wherein an energy gap of the first oxide semiconductor film is different from an energy gap of the second oxide semiconductor film, and
wherein the second oxide semiconductor layer is in contact with side surfaces of the first oxide semiconductor film and side surfaces of the second oxide semiconductor film.

12. The method for manufacturing a semiconductor device according to claim 11, further comprising a step of introducing oxygen into the second oxide semiconductor layer from above the gate insulating layer after the gate insulating layer is formed.

13. The method for manufacturing a semiconductor device according to claim 11, further comprising a step of introducing a dopant into the first oxide semiconductor layer and the second oxide semiconductor layer with use of the gate electrode layer as a mask after the gate electrode layer is formed.

14. The semiconductor device according to claim 5,
wherein the side surfaces of the first oxide semiconductor film are outer side surfaces, and
wherein the side surfaces of the second oxide semiconductor film are outer side surfaces.

15. The method for manufacturing a semiconductor device according to claim 11, wherein c-axes of crystals are aligned in a direction perpendicular to a surface of the first and second oxide semiconductor layers.

16. A semiconductor device comprising:
a substrate;
a first oxide semiconductor film over the substrate;
a second oxide semiconductor film over the first oxide semiconductor film;
a third oxide semiconductor film over the second oxide semiconductor film;
a gate insulating layer over the third oxide semiconductor film; and
a gate electrode layer overlapping with at least the second oxide semiconductor film with the gate insulating layer interposed therebetween,
wherein an energy gap of the first oxide semiconductor film is different from an energy gap of the second oxide semiconductor film, and
wherein the third oxide semiconductor film covers and is in contact with side surfaces of the first oxide semiconductor film and side surfaces of the second oxide semiconductor film.

17. The semiconductor device according to claim 16,
wherein the energy gap of the first oxide semiconductor film is larger than or equal to 3 eV, and
wherein the energy gap of the second oxide semiconductor film is smaller than 3 eV.

18. The semiconductor device according to claim 16,
wherein an energy gap of the third oxide semiconductor film is equal to the energy gap of the first oxide semiconductor film.

19. The semiconductor device according to claim 16,
wherein the third oxide semiconductor film includes an impurity region, and wherein the impurity region does not overlap with the gate electrode layer.

20. The semiconductor device according to claim 16,
wherein the first oxide semiconductor film, the second oxide semiconductor film and the third oxide semiconductor film each include crystals, and
wherein c-axes of the crystals are aligned in a direction perpendicular to a surface of the second oxide semiconductor film.

21. A method for manufacturing a semiconductor device, comprising the steps of: forming a first oxide semiconductor layer and a second oxide semiconductor layer over a substrate, wherein the second oxide semiconductor layer is provided over the first oxide semiconductor layer; forming an oxide semiconductor film over the second oxide semiconductor layer so as to cover and be in contact with side surfaces of the first oxide semiconductor layer and side surfaces of the second oxide semiconductor layer; processing the oxide semiconductor film to form a third oxide semiconductor layer which covers and is in contact with the side surfaces of the first oxide semiconductor layer and the side surfaces of the second oxide semiconductor layer; forming a gate insulating layer over the third oxide semiconductor layer; and forming a gate electrode layer overlapping with at least the second oxide semiconductor layer with the gate insulating layer interposed therebetween, and wherein an energy gap of the first oxide semiconductor layer is different from an energy gap of the second oxide semiconductor layer.

22. The method for manufacturing a semiconductor device according to claim 21, further comprising a step of introducing oxygen into the third oxide semiconductor layer from above the gate insulating layer after the gate insulating layer is formed.

23. The method for manufacturing a semiconductor device according to claim 21, further comprising a step of introducing a dopant into the third oxide semiconductor layer with use of the gate electrode layer as a mask after the gate electrode layer is formed.

24. The method for manufacturing a semiconductor device according to claim 21,
wherein the first oxide semiconductor layer, the second oxide semiconductor layer, and the third oxide semiconductor layer each include crystals, and
wherein c-axes of the crystals are aligned in a direction perpendicular to a surface of the second oxide semiconductor layer.

* * * * *